United States Patent
Davis-Marsh et al.

(10) Patent No.: US 11,870,347 B2
(45) Date of Patent: Jan. 9, 2024

(54) SPREAD SPECTRUM MODULATION OF RISING AND FALLING EDGE DELAYS FOR CURRENT MODE SWITCHING CONVERTERS

(71) Applicant: Texas Instruments Incorporated, Dallas, TX (US)

(72) Inventors: Marc Davis-Marsh, San Jose, CA (US); Abdallah Obidat, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 134 days.

(21) Appl. No.: 17/588,144

(22) Filed: Jan. 28, 2022

(65) Prior Publication Data
US 2023/0246549 A1    Aug. 3, 2023

(51) Int. Cl.
*H02M 3/158* (2006.01)
*H02M 1/44* (2007.01)
*H02M 1/15* (2006.01)
*H03K 5/13* (2014.01)
*H02M 1/38* (2007.01)

(52) U.S. Cl.
CPC ............ *H02M 3/158* (2013.01); *H02M 1/15* (2013.01); *H02M 1/44* (2013.01); *H02M 1/38* (2013.01); *H03K 5/13* (2013.01)

(58) Field of Classification Search
CPC ....... H02M 1/14–15; H02M 1/38–385; H02M 1/44; H02M 3/156–1588; H03K 5/13
See application file for complete search history.

(56) References Cited

U.S. PATENT DOCUMENTS

| | | | |
|---|---|---|---|
| 9,065,427 B2 | 6/2015 | Kleinpenning et al. | |
| 9,450,478 B1 | 9/2016 | Djenguerian et al. | |
| 10,088,854 B2 | 10/2018 | Pham et al. | |
| 10,686,375 B1 | 6/2020 | Davis-Marsh | |
| 11,152,919 B1 | 10/2021 | Davis-Marsh | |
| 11,177,738 B1 * | 11/2021 | Pahkala | H03K 5/24 |
| 2005/0253636 A1 * | 11/2005 | Yang | H02M 3/33507 327/172 |
| 2007/0290894 A1 * | 12/2007 | Ng | H02M 3/157 341/50 |
| 2008/0136395 A1 * | 6/2008 | Bennett | H02M 3/156 323/288 |
| 2009/0066338 A1 | 3/2009 | Yonezawa | |
| 2010/0188129 A1 | 7/2010 | Ma | |

(Continued)

*Primary Examiner* — Fred E Finch, III
(74) *Attorney, Agent, or Firm* — Ray A. King; Frank D. Cimino

(57) ABSTRACT

An apparatus includes a regulator, a modulation circuit, a first delay generator, and a second delay generator. The regulator generates a regulator control output signal to control a current of a power converter to regulate an output voltage of the power converter, the modulation circuit modulates a switching frequency of the power converter, the first delay generator controls a first delay time to turn on a switch of the power converter in a switching cycle, based on a change in the switching frequency of the power converter, and the second delay generator controls a second delay time to turn the switch of the power converter off in the switching cycle, based on the first delay time and a duty cycle of the power converter.

20 Claims, 17 Drawing Sheets

(56) References Cited

U.S. PATENT DOCUMENTS

| | | | |
|---|---|---|---|
| 2010/0194445 A1* | 8/2010 | Balakrishnan | H02M 3/33507 |
| | | | 327/108 |
| 2011/0110126 A1 | 5/2011 | Morrish | |
| 2011/0037505 A1 | 7/2011 | Kawamoto | |
| 2012/0194162 A1 | 8/2012 | Lin et al. | |
| 2013/0051089 A1 | 8/2013 | Pan et al. | |
| 2014/0036552 A1 | 2/2014 | Saji | |
| 2014/0070971 A1 | 3/2014 | Zabroda | |
| 2014/0091774 A1 | 4/2014 | Srinivasan et al. | |
| 2015/0200593 A1 | 7/2015 | Stoichita et al. | |
| 2015/0326116 A1* | 11/2015 | Zhang | H02M 1/44 |
| | | | 323/288 |
| 2016/0134186 A1 | 5/2016 | Saint-pierre et al. | |
| 2017/0070149 A1 | 3/2017 | Guan et al. | |
| 2017/0104412 A1 | 4/2017 | Tsai et al. | |
| 2018/0083608 A1 | 3/2018 | Cho et al. | |
| 2019/0097535 A1* | 3/2019 | Otsuka | H02M 1/08 |
| 2019/0115986 A1 | 4/2019 | Goller | |

* cited by examiner

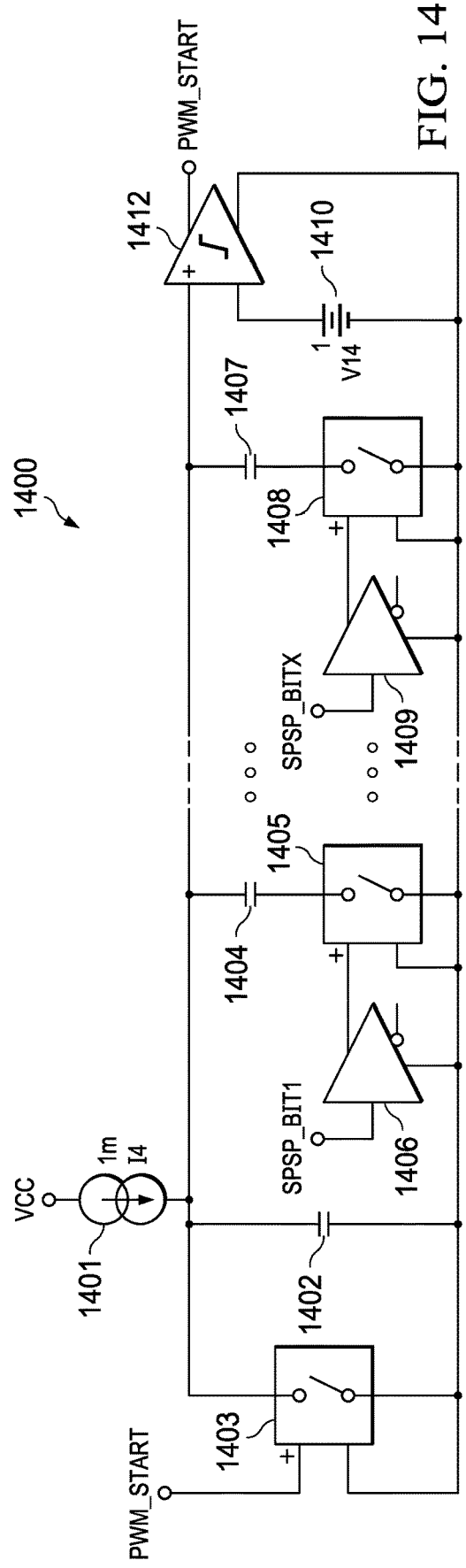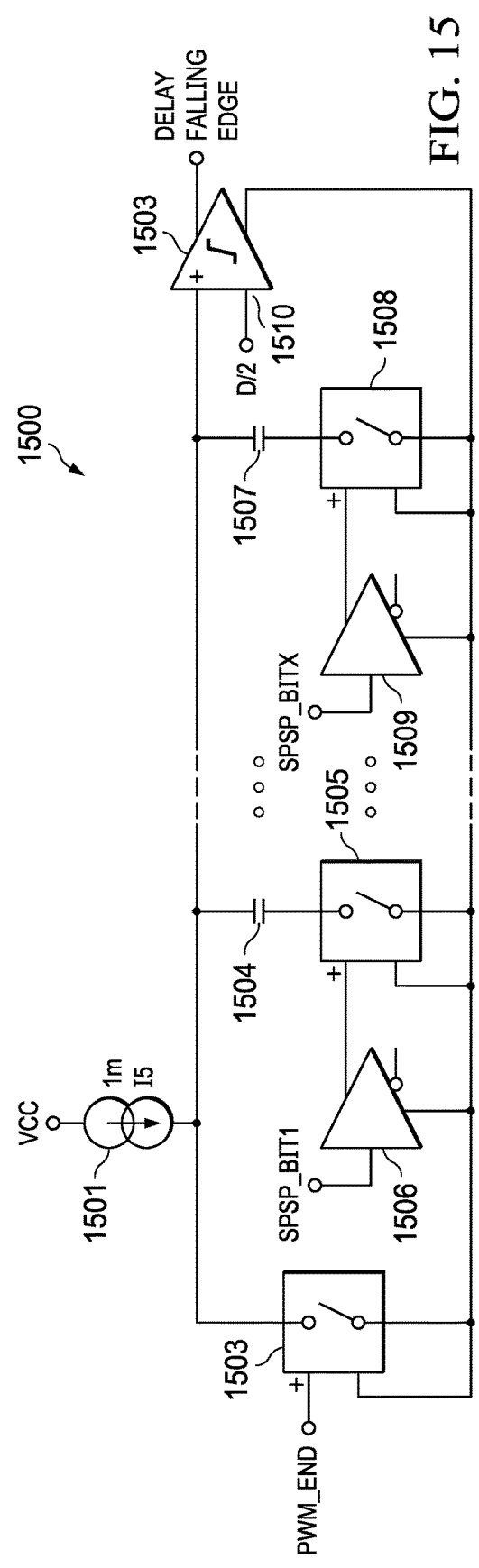

SPREAD SPECTRUM MODULATION OF RISING AND FALLING EDGE DELAYS FOR CURRENT MODE SWITCHING CONVERTERS

BACKGROUND

Spread spectrum frequency modulation can be used in DC-to-DC converters, switching regulators or other switch mode power supplies (SMPs) to reduce the energy in certain frequency bands, for example, in electronic devices and products compliant with regulation standards. Spread spectrum techniques can cause increased noise at the spread spectrum modulation frequency, which appears as one or more low frequency spur or spurs in the frequency domain and as ripple on the input and output of the converter. The increased noise can degrade the low-frequency range performance of the converter. Compensating regulation control signals can address this problem but requires converter inductor information for correct gain adjustment.

SUMMARY

In one aspect, an apparatus includes a regulator, a clock generator, a current control comparator, and a driver circuit. The regulator has a feedback input adapted to be coupled to a power output of a power converter, as well as a regulator control output, and a duty cycle output. The clock generator has a spread spectrum modulation circuit, a first delay generator, a second delay generator, a first output, and a second output. The spread spectrum modulation circuit has a modulation output. The first delay generator has an input and a first delay output. The input of the first delay generator is coupled to the modulation output, and the first delay output is coupled to the first output. The second delay generator has a first input, a second input, a duty cycle input, and a second delay output. The first input of the second delay generator is coupled to the first delay output, the duty cycle input is coupled to the duty cycle output, and the second delay output is coupled to the second output. The current control comparator has first and second comparator inputs and a comparator output. The first comparator input is coupled to a current sense output of the power converter, the second comparator input is coupled to the regulator control output, and the comparator output is coupled to the second input of the second delay generator. The driver circuit has a first signal input, a second signal input, a first signal output, and a second signal output. The first signal input is coupled to the first output and the second signal input is coupled to the second output. The first signal output is adapted to be coupled to a first switch control input of the power converter, and the second signal output is adapted to be coupled to a second switch control input of the power converter.

In another aspect, an apparatus has a regulator, a modulation circuit, and first and second delay generators. The regulator is configured to generate a regulator control output signal to control a current of a power converter to regulate an output voltage of the power converter. The modulation circuit is configured to modulate a switching frequency of the power converter. The first delay generator is configured to control a first delay time to turn on a switch of the power converter in a switching cycle, based on a change in the switching frequency of the power converter. The second delay generator is configured to control a second delay time to turn the switch of the power converter off in the switching cycle, based on the first delay time and a duty cycle of the power converter.

In a further aspect, a system includes a power converter, a regulator, a modulation circuit, a first delay generator, and a second delay generator. The power converter is configured to receive an input voltage and provide an output voltage. The regulator is configured to generate a regulator control output signal to control a current of the power converter to regulate the output voltage. The modulation circuit is configured to modulate a switching frequency of the power converter. The first delay generator is configured to control a first delay time to turn on a switch of the power converter in a switching cycle, based on a change in the switching frequency of the power converter. The second delay generator is configured to control a second delay time to turn the switch of the power converter off in the switching cycle, based on the first delay time and a duty cycle of the power converter.

BRIEF DESCRIPTION OF THE DRAWINGS

FIG. 14 is a schematic diagram of an example first delay circuit for spread spectrum frequency modulation.

FIG. 15 is a schematic diagram of an example second delay circuit for spread spectrum frequency modulation.

DETAILED DESCRIPTION

Figure 1:
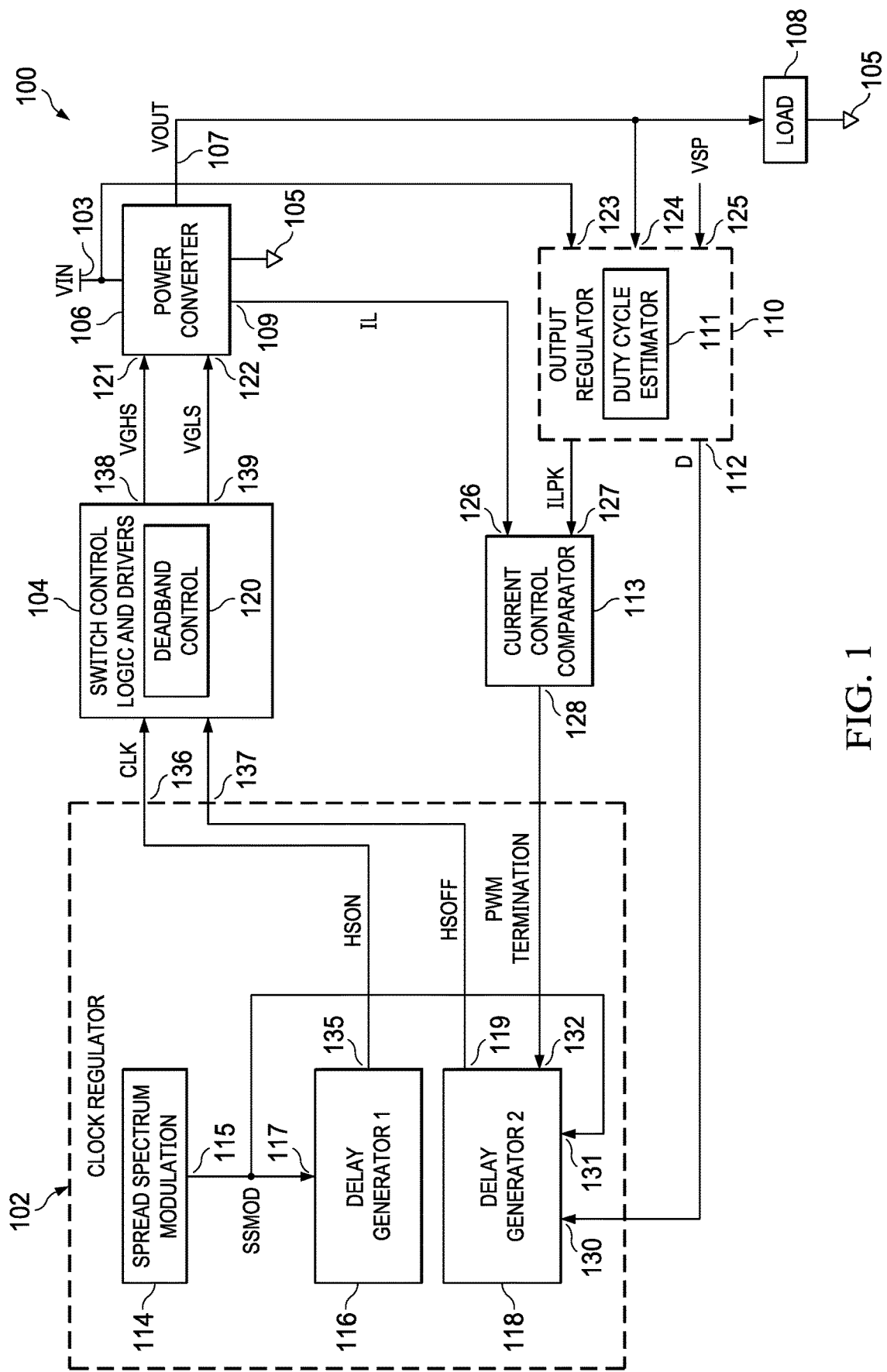
FIG. 1 is a block diagram of an example switched mode power supply.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a switched mode power supply system 100 with current control apparatus including a clock generator 102, a switch control logic and driver circuit 104 configured to operate switching devices of a power converter 106 to power a load 108. In operation, when the system 100 is powered, the power converter 106 receives an input voltage VIN at a power input 103 and provides an output voltage VOUT at a power output 107. The input and output voltages are referenced in one example to a circuit ground or common connection 105. The power converter 106 has a current sense output 109 that provides a converter current signal IL that represents a current of the power converter 106, such as an inductor current. The example apparatus also includes an output regulator 110 having a duty cycle estimator 111 and a duty cycle output 112, as well as a current control comparator 113. In one implementation, the clock generator 102, the switch control logic and driver circuit 104, the regulator 110 and the current control comparator 113 are integrated in a single packaged electronic device with terminals adapted to be coupled to the power converter 106. In this or another example, one or more components of the power converter 106 (e.g., converter switching devices and optionally a converter inductor) are integrated with the clock generator 102, the switch control logic and driver circuit 104, the regulator 110 and the current control comparator 113 in a single packaged electronic device.

The clock generator 102 has a spread spectrum modulation circuit 114 with a modulation output 115. In operation, the spread spectrum modulation circuit 114 generates a modulation signal SSMOD at a spread spectrum modulating frequency at the modulation output 115. The clock generator 102 also includes a first delay generator 116 with a first delay output 117, and a second delay generator 118 with a second delay output 119. In operation, the first delay generator 116 generates a first switch signal HSON based on the modulation signal SSMOD at the first delay output 117. In operation, the second delay generator 118 generates a second switch signal HSOFF at the second delay output 119, triggered by the output of the 128 comparator 113 and delayed by an amount calculated from the duty cycle estimator 111, and the modulation command SSMOD generated by the spread spectrum modulation circuit 114.

The clock generator 102 provides the first switch signal HSON as a PWM clock signal CLK to the switch control logic and driver circuit 104 and provides the second switch signal HSOFF to the switch control logic and driver circuit 104, to control respective turn on and turn off of a first switch of the power converter 106. In one example, the switch control logic and driver circuit 104 includes a deadband circuit 120 to mitigate concurrently turning two switches of the power converter 106 on. The switch control logic and driver circuit 104 provides a first switch control signal VGHS to a first switch control input 121 of the power converter 106 and provides a second switch control signal VGLS to a second switch control input 122 of the power converter 106. In one example, the first switch control signal VGHS is provided to a gate of a high side first switch of the power converter, and the second switch control signal VGLS is provided to a gate of a low side second switch of the power converter 106. In operation, the deadband circuit 120 prevents the first and second switches being turned on at the same time, for example, by ensuring one switch is turned off before the other is turned on.

The control apparatus of the system 100 operates the power converter switches to cause the power converter 106 to convert the input voltage VIN at the power input 103 to provide the output voltage VOUT at the power output 107 to power the load 108. The regulator 110 in one example has an input 123 coupled to the power input 103 to receive the input voltage VIN, as well as a feedback input 124 coupled to the power output 107 to receive the output voltage VOUT for use by the duty cycle estimator 111. The feedback input 124 is, or is adapted to be, coupled to the power output 107 of the power converter 106. In one example, the regulator 110 has a setpoint or reference input 125 to receive an output voltage setpoint or command signal VSP, for example, from an external source. In operation in one example, the regulator 110 determines an error signal or value according to the output voltage VOUT and the voltage setpoint signal VSP and regulates operation of the power converter 106 to drive the error to zero to regulate the output voltage VOUT at a desired value. The regulator 110 is configured to generate a regulator control output signal ILPK at a regulator control output for controlling a current of the power converter 106 to regulate the output voltage VOUT. In one example, the regulator control output signal ILPK is or represents a peak current for controlling high side switch turn off in a given switching control cycle of the power converter 106. In another example, the regulator control output signal ILPK is or represents a valley current for valley current control for controlling the current of the power converter 106 to regulate the output voltage VOUT.

The current control comparator 113 has a first comparator input 126, a second comparator input 127, and a comparator output 128. The first comparator input 126 is coupled to the current sense output 109 of the power converter 106. The second comparator input 127 is coupled to the regulator control output of the regulator 110 to receive the regulator control output signal ILPK. The second delay generator 118 has a duty cycle input 130, a first input 131, a second input 132, and the second delay output 119. The comparator output 128 is coupled to the second input 132 of the second delay generator 118. The first input 131 is coupled to the modulation output 115 and the duty cycle input 130 is coupled to the duty cycle output 112. The first delay generator 116 has an input 117 coupled to the modulation output 115. The clock generator 102 has a first output 136 coupled to the first delay output 135, as well as a second output 137 coupled to the second delay output 119.

The driver circuit 104 has a first signal input coupled to the first output 136, and a second signal input coupled to the second output 137. In addition, the driver circuit 104 has a first signal output 138 that is, or is adapted to be, coupled to the first switch control input 121 of the power converter 106, as well as a second signal output 139 that is, or is adapted to be, coupled to the second switch control input 122 of the power converter 106.

The spread spectrum modulation circuit 114 generates the modulation signal SSMOD at the modulation output 115. The modulation signal SSMOD controls the operating switching frequency ($f_s$) of the power converter 106, for example, in a range of 100 kHz or more. The modulation signal SSMOD has a spread spectrum modulating frequency, for example, approximately 15 kHz. The spread spectrum modulation circuit 114 can implement any form of spread spectrum modulation. In one example, the spread spectrum modulation circuit 114 implements a triangular spread spectrum modulation of the power converter switching frequency. In other possible examples, other types of clocking modulation may be used, such as triangular and pseudo random spread spectrum modulation (e.g., advanced random spread spectrum (ARSS), frequency-hopping spread spectrum (FHSS), direct-sequence spread spectrum (DSSS), time-hopping spread spectrum (THSS), chirp spread spectrum (CSS), or combinations thereof).

The first delay generator 116 is configured to control a first delay time $t_{delay1}$ to turn on a first (e.g., high side) switch of the power converter 106 in a switching cycle, based on a change in the switching frequency of the power converter 106. In one example, the first delay generator 116 implements the spread spectrum modulation by selectively delaying a rising edge of the pulse width modulation (PWM) signal used to turn the high side first power converter switch on in a given switching control cycle of the power converter based on the modulation signal SSMOD from the spread spectrum modulation circuit 114. The spread spectrum modulation helps to reduce the energy in certain frequency bands, for example, in electronic devices and products compliant with regulation standards. The spread spectrum switching frequency is used in one example to reduce electromagnetic interference (EMI) in certain frequency bands, such as to comply with government regulations and/or other technical standards.

However, spread spectrum modulation of the power converter switching frequency can cause increased noise at the spread spectrum modulation frequency. In an example converter implementing a current mode control scheme, if the frequency of the clock is reduced relative to a previous switching control cycle, the power converter will reach the same peak current commanded by an error amplifier, but because of the extended clock period, the valley current will be lower than for the previous cycle. This has the net effect of a lower RMS inductor current, to which the error amplifier would need to adjust in the absence of the solution herein. The reaction affects the output voltage, and the modulation of the converter switching frequency at the spread spectrum modulation frequency adds noise and output voltage ripple. The spread spectrum modulation noise can appear as one or more low frequency spur or spurs in the frequency domain and as ripple on the input and output of the converter. For triangular modulation, the period of the triangular modulation can appear on the output voltage VOUT and as a spur on conducted input current measurements in frequency measurements. For pseudo random spread spectrum, the spurs can appear with lower magnitude but spread over a much broader frequency range.

To address these problems, the example apparatus provides rising edge delay via the first delay generator 116 based on the modulation signal SSMOD as well as falling edge delay via the second delay generator 118 to mitigate or avoid adverse effects of spread spectrum modulation, such as DC ripple of the input or output of the power converter 106 and/or low frequency noise at or around the spread spectrum modulating frequency. The second delay generator 118 is configured to control a second delay time $t_{delay2}$ to turn the first (e.g., high side) switch of the power converter 106 off in the switching cycle, based on the first delay time $t_{delay1}$ and a duty cycle of the power converter 106. The described examples provide a solution to these issues while enabling spread spectrum functionality and its advantages, and also improve the low-frequency range of the FFT of the device. The described examples can be used in association with many different forms and types or switching converters, such as buck, boost, cuk, synchronous rectifier, buck-boost, isolated topologies, such as flyback topologies, etc. The buck converter configuration is used as an example as described further below in connection with FIG. 2. Moreover, the described solutions can be used in connection with any form of current control used in controlling the power converter 106 to regulate the output voltage VOUT. For example, the described implementations use peak current control in which an inductor current of the power converter 106 is compared to a peak current setpoint signal or value (e.g., ILPK in FIG. 1) to cause the high side converter switch to be turned off in a given switching control cycle. In another implementation, valley control is used. In these or another implementation, average current control concepts can be used.

Figure 2:
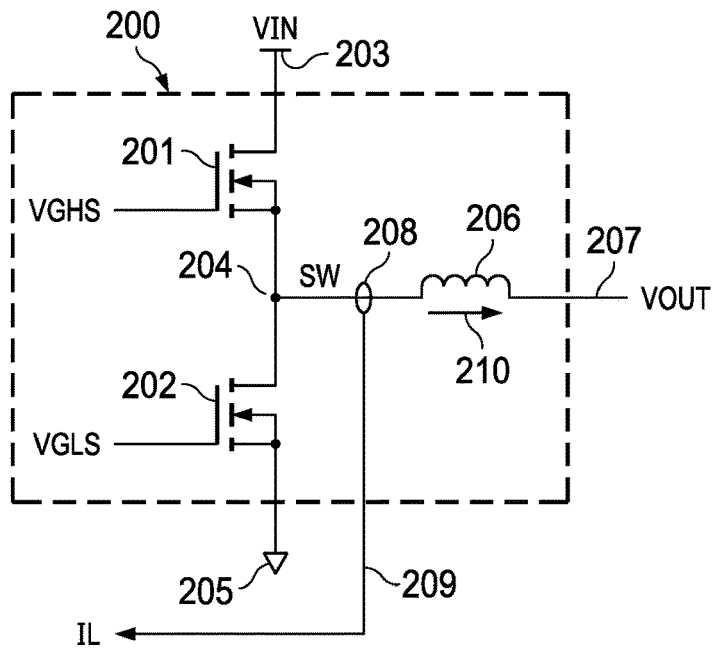
FIG. 2 is a schematic diagram of the power stage for of a buck DC to DC converter.

Referring also to FIG. 2, in one example, a buck DC-to-DC converter 200 is used as the power converter 106 in FIG. 1. FIG. 2 shows one implementation of the converter 200, which includes a first switch 201, such as an n-channel field effect transistor (FET) with a drain, a source, and a gate control terminal, as well as a second switch 202 (e.g., an n-channel FET) having a drain, a source, and a gate control terminal. The drain of the first switch 201 is coupled to a power input 203 to receive the input voltage VIN. The source of the first switch 201 and the drain of the second switch 202 are coupled to one another at a switch node 204. The source of the second switch 202 is coupled to a circuit ground or common connection 205 (e.g., 105 in FIG. 1). The first and second switches 201 and 202 are configured in a buck converter arrangement with an output inductor 206 coupled between the switch node 204 and a power output 207 (e.g., the power output 107 in FIG. 1). The power converter 200 also includes a current sensor 208 and a current sense output 209 (e.g., 109 in FIG. 1) that provides the converter current signal IL that represents the inductor current 210 of the inductor 206 in operation of the power converter 200.

The gate of the first switch 201 is driven by the first switch control signal VGHS, and the gate of the second switch 202 is driven by the second switch control signal VGLS. The first switch 201 is referred to as a high side switch and the second switch 202 is referred to as a low side switch. The power converter 200 can include one or more different forms and types of switch devices (e.g., n-channel and/or p-channel power field effect transistors (FETs) or bipolar junction transistors (BJTs)) coupled in a circuit with the power input and the power output in a configuration to convert the input voltage VIN to provide the output voltage VOUT and current to a load (e.g., load 108 in FIG. 1) in response to the switch control signal VGHS and VGLS. In other buck or boost converter examples, the power converter 106 can have a single high side switch (e.g., 201 in FIG. 2), and the second switch 202 is replaced with a diode having an anode coupled to the circuit ground or common connection 205 and a cathode coupled to the switch node 204, and the second switch control signal VGLS is omitted.

The regulator 110 is configured to generate the regulator control output signal ILPK to control the current IL of the power converter 106 to regulate the output voltage VOUT of the power converter 106. In the example of FIG. 1, the regulator 110 generates a regulator control output signal ILPK at the regulator control output to control the current IL of the power converter 106 to regulate the voltage VOUT of the power output 107. The spread spectrum modulation circuit 114 is configured to modulate the switching frequency of the power converter 106 at the spread spectrum modulating frequency (e.g., approximately 15 kHz). The first delay generator 116 is configured to control a first delay time $t_{delay1}$ to turn on the first switch (e.g., 201 in FIG. 2) of the power converter 106 in a switching cycle, based on a change in the switching frequency of the power converter 106. The second delay generator 118 is configured to control a second delay time $t_{delay2}$ to turn the first switch (e.g., 201) of the power converter 106 off in the switching cycle, based on the first delay time $t_{delay1}$ and a duty cycle of the power converter 106. The current control comparator 113 generates a comparator output signal PWM Termination at the comparator output 128, based on the converter current signal IL of the first comparator input 126 and the regulator control output signal ILPK of the second comparator input 127.

The driver circuit 104 is configured to generate the first switch control signal VGHS at the first signal output 138. The first switch control signal VGHS has a first edge and a second edge in a switching cycle of the power converter 106. The regulator 110 generates the duty cycle signal D at the duty cycle output 112 based on the output voltage VOUT of the power output 107 and the input voltage VIN of a power input 103 of the power converter 106. The duty cycle signal D represents the duty cycle of the power converter 106 (e.g., duty cycle=VOUT/VIN). The driver circuit 104 is configured to control timing of the first edge of the first switch control signal VGHS based on the first switch signal HSON, and control timing of the second edge of the first switch control signal VGHS based on the second switch signal HSOFF. The first edge of the first switch control signal VGHS controls turn on of the first switch 201 of the power converter 106 in the switching cycle based on the first switch signal HSON. The second edge of the first switch control signal VGHS controls turn off of the first switch 201 in the switching cycle based on the second switch signal HSOFF.

In one example, the edge of the first switch signal HSON is delayed, from an edge of a, reference clock signal, by a first delay time $t_{delay1}$ where the first delay time $t_{delay1}$ is controlled by the first delay generator 116 based on the modulation signal SSMOD. The second switch signal HSOFF has a second edge that is delayed, from an edge of the comparator output signal PWM Termination, by a second delay time $t_{delay2}$. In one example, the second delay time $t_{delay2}$ is less than a product of the first delay time $t_{delay1}$ and the duty cycle of the power converter 106. In one implementation, the second delay time $t_{delay2}$ is approximately half the product of the first delay time $t_{delay1}$ and the duty cycle of the power converter 106 (e.g., $t_{delay2}=0.5*D*t_{delay1}$).

The driver circuit 104 in one example is configured to generate the second switch control signal VGLS at the second signal output 139. The second switch control signal VGLS has a first edge and a second edge in the switching cycle. The first edge of the second switch control signal VGLS controls turn on of the second switch (e.g., 202 in FIG. 2) of the power converter 106 in the switching cycle.

The second edge of the second switch control signal VGLS control turn off of the second switch (e.g., 202) in the switching cycle. The driver circuit 104 in this example controls timing of the first edge of the second switch control signal VGLS based on the second switch signal HSOFF and a deadband delay of the deadband control circuit 120, and controls timing of the second edge of the second switch control signal VGLS based on the first switch signal HSON and the deadband delay.

By modulating both falling and rising edges of the first switch signal HSON with a spread spectrum pattern, the duty cycle can be maintained. The dual edge delay with spread spectrum switching frequency modulation mitigates or avoids changes in the average inductor current of the power converter 106, and reduces the ripple caused by the spread spectrum on the output voltage VOUT and input current of the power converter 106. In other spread spectrum systems, the frequency is modulated on only one edge of the switching cycle, for example, using a periodic triangular waveform. In trailing edge modulation such as peak current mode, voltage mode etc., the rising edge frequency is modulated by the spread spectrum and the falling edge is dictated by the control loop. In the apparatus of FIG. 1, the second delay generator 118 adds a delay line for the falling edge $t_{delay2}$, that is proportional to the delay caused by the spread spectrum on the rising edge Delays and proportional to the duty cycle (e.g., $t_{delay2}$ is approximately $0.5*D*t_{delay1}$), where the scaling factor 0.5 in this implementation can vary +/−10%, such as from 0.45 to 0.55, based on component tolerance variations in the circuit components of the clock generator 102.

By controlling both edges, the average current can be maintained under modulation with limited adverse effect on the operating point of the control loop implemented by the output regulator 110. In certain example, the second delay generator 118 adds a delay to the rising edge of the clock, and a delay that is proportional to D and the delay of the falling edge of the clock. Example circuit implementations apply delays to the rising and falling edges of the clock such that the overall voltage ripple is reduced (e.g., minimized). This result greatly improves EMI performance at the lower frequency range.

Figure 4:
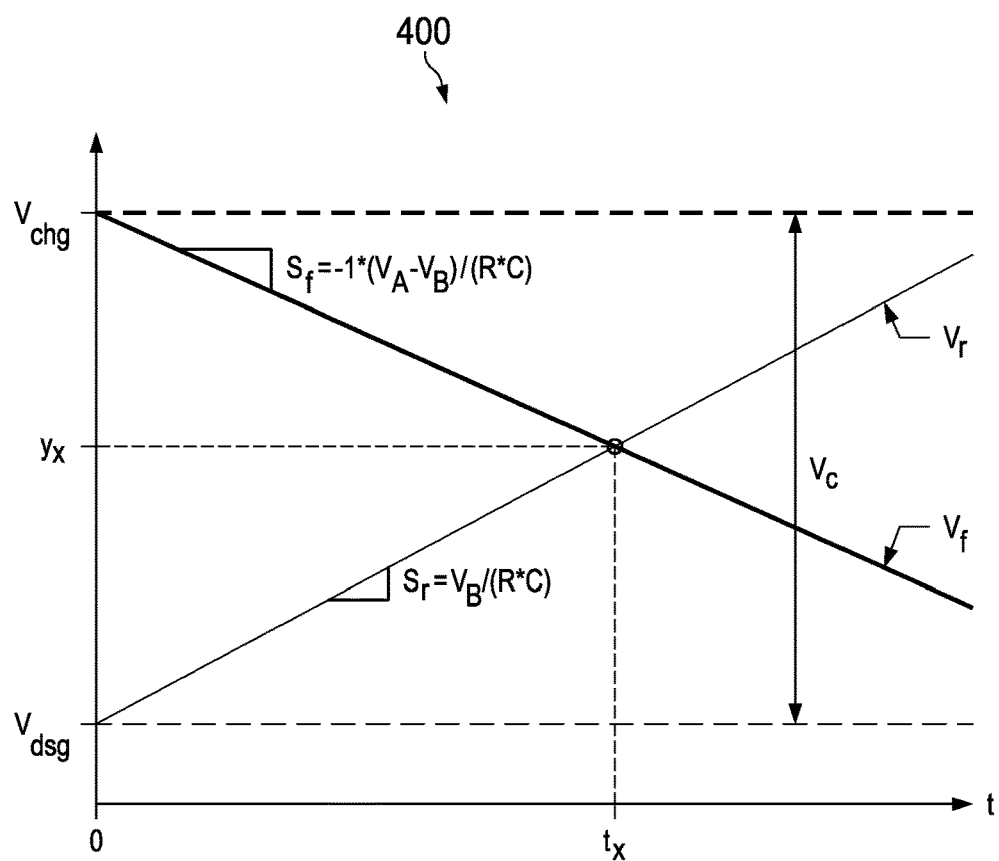
FIG. 4 is a signal diagram of signal waveforms in the duty cycle estimator circuit of FIG. 3.
Figure 3:
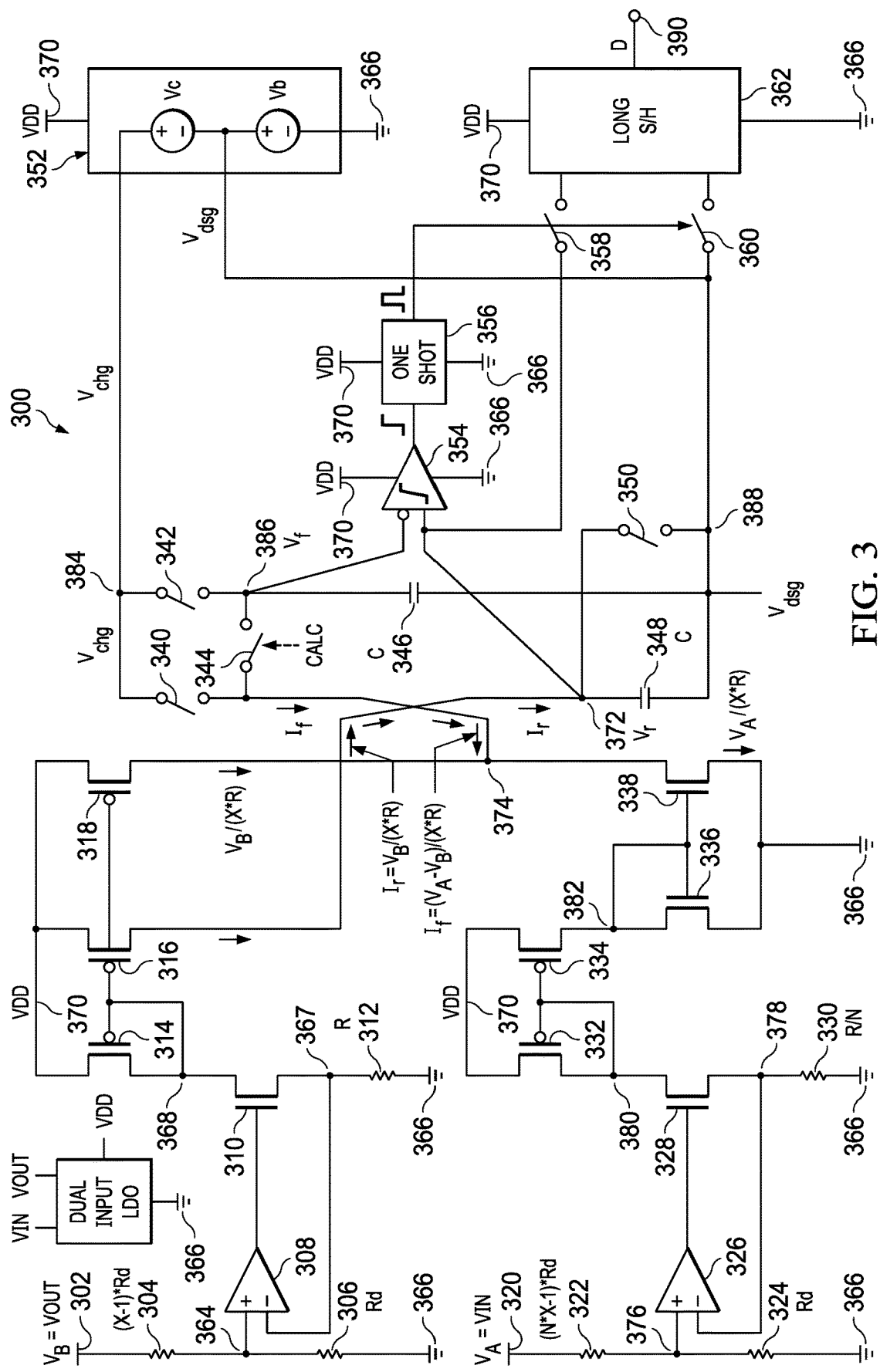
FIG. 3 is a schematic diagram of an example duty cycle estimator circuit.

Referring now to FIGS. 3 and 4, FIG. 3 shows an example duty cycle estimator circuit 300 that can be used as the duty cycle estimator circuit 111 in the system 100 of FIG. 1, and FIG. 4 shows a signal diagram of signal waveforms in the duty cycle estimator circuit 300. In this implementation one capacitor is charged with a current proportional to VOUT and another is discharged from a starting voltage of 1V with a current proportional to VIN-VOUT. When the capacitor voltages are equal, the capacitor voltage is sampled by an output sample and hold circuit and the output voltage D represents the ratio of VOUT/VIN=the power converter duty cycle. If VIN and VOUT are swapped on the input terminals then the output voltage represents VIN/VOUT=1/duty cycle. In one example, the described voltage VA=VOUT and VB=VIN of the power converter 106 of FIG. 1. In an example architecture of the circuit 300, the resistor 304 is coupled between a voltage source 302 and a node 364. The resistor 306 is coupled between the node 364 and ground 366. The amplifier 308 has a non-inverting input coupled to the node 364 and an inverting input coupled to a node 367. An output of the amplifier 308 is coupled to a gate of the transistor 310. A source of the transistor 310 is coupled to the node 367 and a drain of the transistor 310 is coupled to a node 368. The resistor 312 is coupled between the node 367 and ground 366. The transistor 314 has a gate and a drain coupled to the node 368 and a source coupled to a voltage source 370. The transistor 316 has a gate coupled to the node 368, a drain coupled to a node 372, and a source coupled to the voltage source 370. The transistor 318 has a gate coupled to the node 368, a drain coupled to a node 374, and a source coupled to the voltage source 370.

As further shown in FIG. 3, the resistor 322 is coupled between a voltage source 320 and a node 376. The resistor 324 is coupled between the node 376 and ground 366. The amplifier 326 has a non-inverting input coupled to the node 376 and an inverting input coupled to a node 378. An output of the amplifier 326 is coupled to a gate of the transistor 328. A source of the transistor 328 is coupled to the node 378 and a drain of the transistor 328 is coupled to a node 380. The resistor 330 is coupled between the node 378 and ground 366. The transistor 332 has a gate and a drain coupled to the node 380 and a source coupled to the voltage source 370. The transistor 334 has a gate coupled to the node 380, a drain coupled to a node 382, and a source coupled to the voltage source 370. The transistor 336 has a gate and drain coupled to the node 382 and a source coupled to ground 366. The transistor 338 has a gate coupled to the node 382, a drain coupled to the node 374, and a source coupled to ground 366.

The switch 340 is coupled between a node 384 and the node 374. The switch 342 is coupled between the node 384 and a node 386. The switch 344 is coupled between the node 374 and the node 386. The capacitor 346 is coupled between the node 386 and a node 388. The capacitor 348 and the switch 350 are each coupled between the node 372 and the node 388. The bias circuit 352 is coupled between the voltage source 370 and ground 366 and has a first output coupled to the node 384 and a second output coupled to the node 388. The comparator 354 has a first input (e.g., a negative or inverting input) coupled to the node 386 and a second input (e.g., positive or non-inverting input) coupled to the node 372. An output of the comparator 354 is coupled to an input of the one-shot pulse generator 356. The switch 358 is coupled between the node 372 and a first input of the sample and hold circuit 362. The switch 360 is coupled between the node 388 and a second input of the sample and hold circuit 362. The sample and hold circuit 362 is coupled between the voltage source 370 and ground 366 and has an output coupled to a node 390.

In at least some examples, the voltage source 302 has a voltage of VB (e.g., VB=VIN in FIG. 1), the resistor 304 has a resistance of (X−1)*Rd, the resistor 306 has a resistance of Rd, and the resistor 312 has a resistance of R. In at least some examples, X has any suitable value at least partially based on a dynamic range of VB to adapt the voltage divider formed by the resistor 304 and the resistor 306 to a common mode range of the amplifier 308. The voltage source 320 has a voltage of VA, the resistor 322 has a resistance of (N*X−1)*Rd, the resistor 324 has a resistance of Rd, and the resistor 330 has a resistance or R/N. In at least some examples, N has any suitable value at least partially based on a dynamic range of VA to adapt the voltage divider formed by the resistor 322 and the resistor 324 to a common mode range of the amplifier 326. Also, in at least some examples, the amplifier 308 and the amplifier 326 have a substantially same common mode range. The voltage source 370 has a value of VDD, which is any value suitable for providing power for operation of components of the circuit 300. In at least some examples, a current (Jr) having a value approximately equal to VB/(X*R) flows through the transistor 316 and the transistor 318 and a current having a value approximately equal to VA/(X*R) flows through the transistor 338.

The capacitor 346 and the capacitor 348 each have a capacitance of C. A voltage Vr exists at the node 372 and a voltage Vf exists at the node 386. The bias circuit 352 provides a bias voltage Vc+Vb as a signal Vchg, in at least some examples derived from VDD, at the node 384 and a bias voltage Vb as a signal Vdsg, also in at least some examples derived from VDD, at the node 388. An output of the circuit 300, indicated as D, is provided at the node 390.

In an example of operation of the circuit 300, VB is sensed from the voltage source 302 and passed through a voltage divider formed by the resistor 304 and the resistor 306 to provide an output of the voltage divider at the node 364. The amplifier 308, transistor 310, and resistor 312 together form a voltage-to-current (V-I) converter that provides a current flowing through the node 368 that is proportional to VB. The transistor 314 and the transistor 316, as well as the transistor 314 and the transistor 318, form current mirrors that mirror the current flowing through the node 368 to the nodes 372 and 374, respectively. Similarly, VA is sensed from the voltage source 320 and passed through a voltage divider formed by the resistor 322 and the resistor 324 to provide an output of the voltage divider at the node 376. The amplifier 326, transistor 328, and resistor 330 together form a V-I converter that provides a current flowing through the node 380 that is proportional to VA. The transistor 332 and the transistor 334 form a current mirror that mirrors the current flowing through the node 380 to the node 382. The transistor 336 and the transistor 338 form a current mirror that mirrors the current flowing through the node 382 to the node 374 such that according to current summation rules, a current (If) flowing through the node 374 is approximately equal to (VA−VB)/(X*R).

The switch 340, switch 342, and switch 350 are each controlled according to CALC' and the switch 344 is controlled according to CALC. For example, responsive to CALC being asserted, the switches 340, 342, and 350 are opened and the switch 344 is closed. Conversely, responsive to CALC being de-asserted, the switches 340, 342, and 350 are closed and the switch 344 is opened. Also responsive to CALC being de-asserted, in at least some examples, the capacitor 346 is initialized according to Vchg and the capacitor 348 is initialized according to Vdsg. In some examples, the capacitor 346 is initialized to a value of about 1 V according to Vchg and the capacitor 348 is initialized to about 0 V according to Vdsg.

Responsive to CALC being asserted, the capacitor 346 is discharged from its initialized value at a rate approximately equal to the current flowing through the node 374 (in at least some examples, approximately (VA−VB)/(X*R)). Similarly, responsive to CALC being asserted, the capacitor 348 is charged from its initialized value at a rate approximately equal to the current flowing through the node 372 (in at least some examples, approximately VB/(X*R)). The comparator 354 compares voltages of the capacitor 346 and the capacitor 348, as represented by Vf and Vr, respectively. Responsive to Vr increasing to equal or exceed Vf an output signal of the comparator 354 becomes asserted. Responsive to the output signal of the comparator 354 becoming asserted (e.g., at a rising edge of the output signal of the comparator 354) the one-shot pulse generator 356 provides a pulse width modulation (PWM) signal pulse having a programmed duration. The duration of the PWM signal pulse may be any suitable duration.

In at least some examples, the PWM signal pulse controls the switches 358 and 360. For example, responsive to the PWM signal pulse being asserted, the switches 358 and 360 are closed and responsive to the PWM signal pulse being de-asserted, the switches 358 and 360 are opened. Responsive to the switches 358 and 360 being closed, the sample and hold circuit 362 samples a voltage across the capacitor 348 (e.g., Vr and Vdsg). The sample and hold circuit 362 provides a value at the node 390 representing the voltage across the capacitor 348. The value is, in some examples, D and is an output of the circuit 300. After determining D, the circuit 300 may be reset by de-asserting CALC such that the capacitor 346 and the capacitor 348 are each re-initialized.

In some examples, by controlling values of VA, VB, and VC, various mathematical functions may be implemented by the circuit 300. For example, responsive to VA being equal to VIN, VB is equal to VOUT, and VC is 1 V, D, ranging from 0 V to 1 V, represents a duty cycle of the power converter corresponding to VIN and VOUT. More generally, responsive to VA having a value of 1 V, D is approximately equal to a product of a multiplication of VB and VC. Similarly, responsive to VC having a value of 1 V, D is approximately equal to a quotient of a division of VB by VA, or if VB has a value of 1 V, D is approximately equal to a quotient of a division of VC by VA.

FIG. 4 shows a signal diagram 400 of example signal waveforms. In at least some examples, the signals Vchg, Vdsg, Vr, and Vf as described above with respect to FIG. 3 are shown in the diagram 400. The diagram 400 also shows a slope of Vr (labeled Sr), a slope of Vf (labeled Sf), and the value VC. A horizontal axis of the diagram 400 is representative of time and a vertical axis of the diagram 400 is representative of voltage. As shown by the diagram 400, at a time tx, Vr increases in value to approximately equal, or exceed, a value of Vf tx is approximately equal to ((R*C)/VA)*VC. At tx, a value of Vr (labeled yx) is sampled and is approximately equal to Vdsg+((VB*VC)/VA), which simplifies to (VB*VC)/VA if Vdsg is 0 V as described above with respect to FIG. 3.

Figure 5:
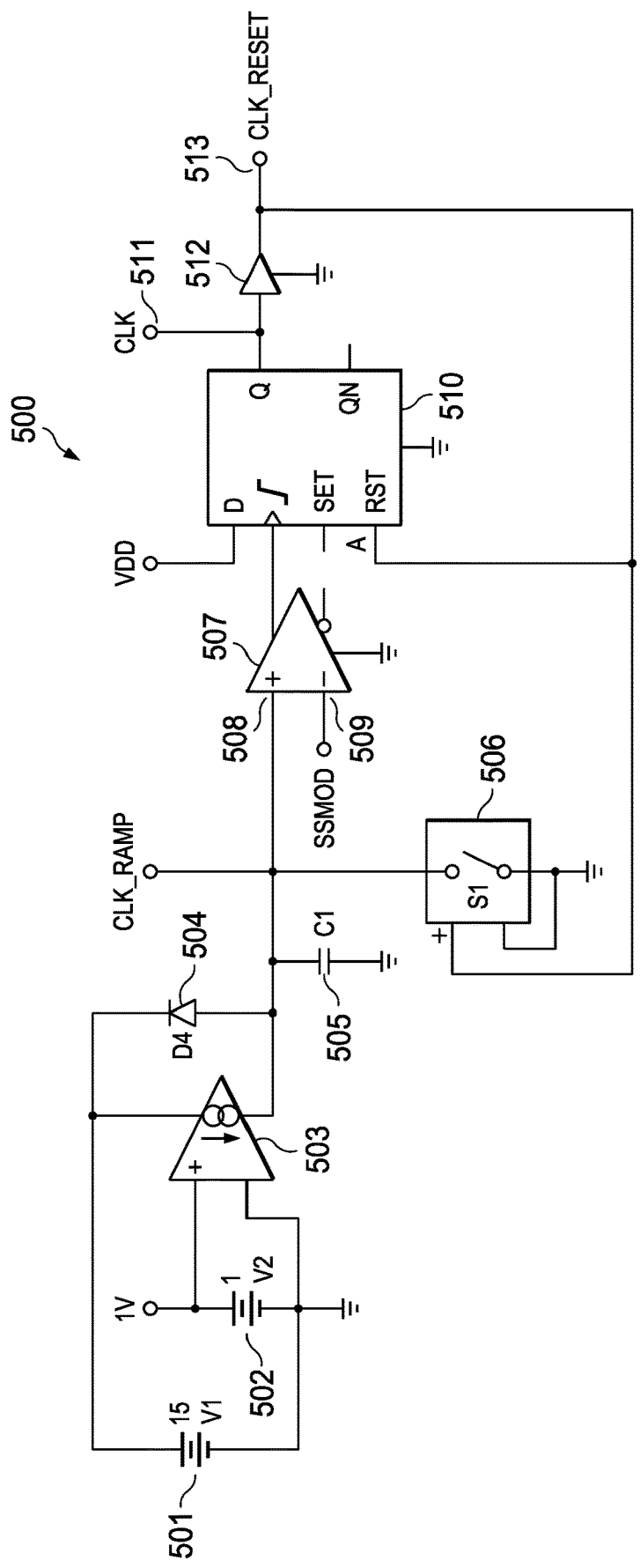
FIG. 5 is a schematic diagram of an example main oscillator with spread spectrum delay on rising edge controlled by a modulated comparator reference.

FIG. 5 shows an example main oscillator circuit 500 with spread spectrum delay on rising edge controlled by a comparator reference, which can be used as the spread spectrum modulation circuit 114 in the clock generator 102 of FIG. 1. The circuit 500 includes a first voltage source 501 (V1) and a second voltage source (V2) coupled to a transconductance (GMA) amplifier 503 that provides a current to charge a capacitor 505, with a diode 504 coupled to clamp the capacitor voltage below that of the first voltage source 501. The capacitor voltage of the capacitor 505 provides a clock ramp signal CLK_RAMP which is reset to zero by actuation of a switch 506 based on a clock reset signal CLK_RESET. The clock ramp signal CLK_RAMP is provided to a non-inverting input 508 of an amplifier 507, and an inverting input is coupled to a modulation signal (e.g., SSMOD in FIG. 1) to set the frequency of a clock signal CLK at an output 511 of a flip-flop 510 whose clock input is driven by the output of the amplifier 507. A buffer 512 controls the clock reset signal CLK_RESET based on the clock signal CLK to reset the discharge switch and the flip-flop 510.

Referring to FIGS. 6-10, FIG. 6 shows signal diagrams of switch node voltage $V_{SW}$ and inductor currents (e.g., labeled $i_L$) in the system 100 of FIG. 1, including a graph 600 with a switch node voltage curve 601 illustrating two example PWM switching control cycles of the power converter resulting from alternate switching of the first and second (e.g., high and low side switches) switches (e.g., switches 201 and 202 in FIG. 2). The switch node voltage curve 601 alternates between the input voltage (e.g., labeled VIN) when the high side first switch is turned on and a voltage $-V_{D1}$ below zero when the first switch is off. A graph 610 shows two cycles of an inductor current curve 611 in steady state with no switching frequency modulation using peak current control with the clock signal CLK turning the first switch on to cause the current curve 611 to rise, and the current reaching the peak current km causing the apparatus to turn the first switch off.

Figure 6:
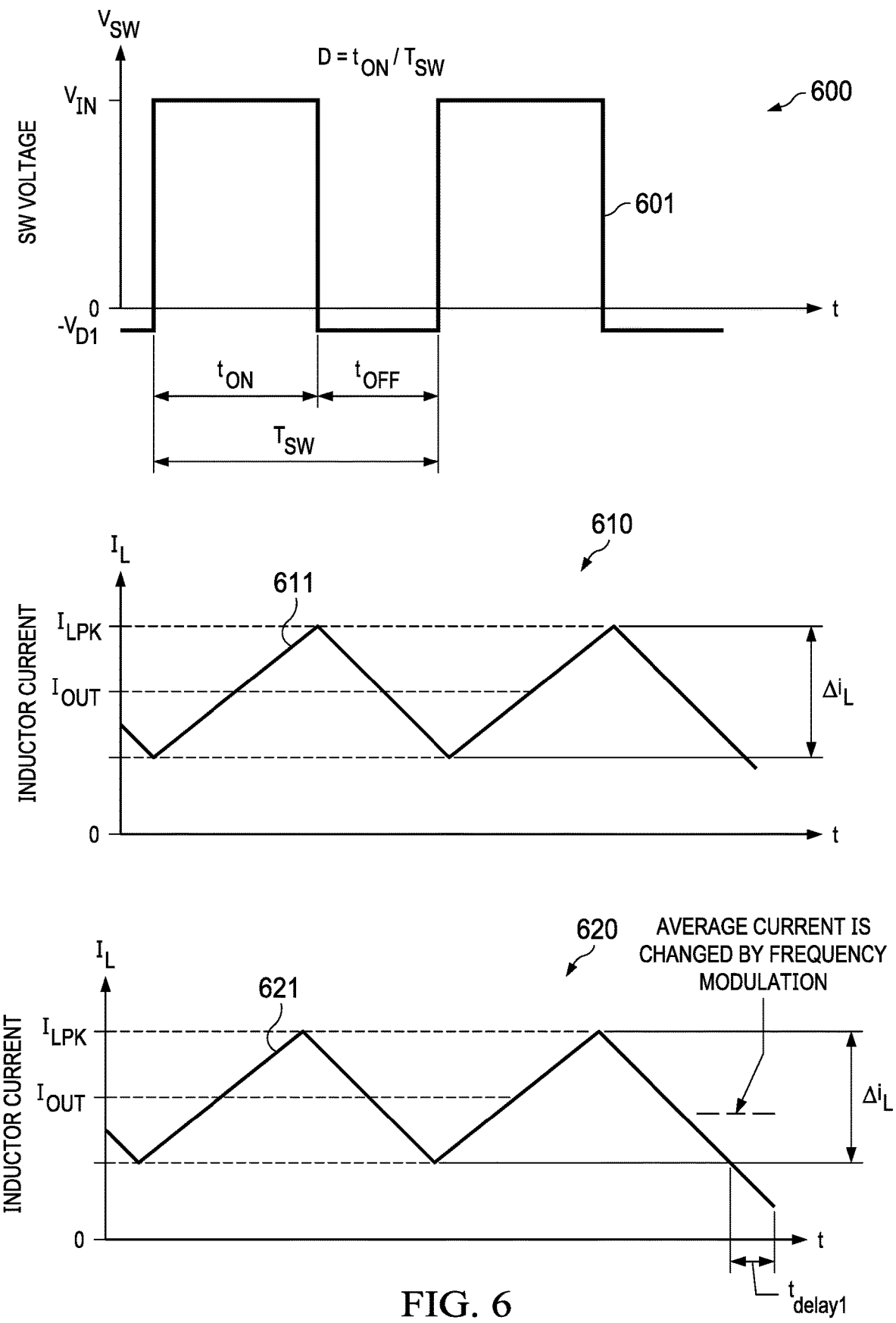
FIG. 6 is a signal diagram of switch node voltage and inductor currents for a buck converter.

A graph 620 in FIG. 6 shows spread spectrum modulation to decrease the switching frequency in the second illustrated peak current control switching control cycle, in which clock signal CLK again turns the first switch on with no falling edge delay to cause the current curve 621 to rise. The extension of the second cycle period by the spread spectrum modulation adds the modulation delay time $t_{delay1}$ to delay the turn on of the first switch after the inductor current curve 621 reaches its previous valley current. As shown in the graph 620, however, this frequency modulation lowers the average inductor current and disturbs the closed loop output voltage regulation.

The improved switching frequency spread spectrum modulation (e.g., dither) of the apparatus in FIG. 1 applies different delays on both the rising and falling edge of the power stage SW node at every pulse period, such that the operating point of the control loop is unperturbed and the average current of the inductor is constant at every period. The benefit of this implementation is improved EMI performance at lower frequencies. The modulating "tone" that is usually caused by the spread spectrum is significantly reduced. Dither can be applied at the rising edge using any suitably configured circuitry, examples of which are shown herein. In this illustrated example, the frequency of the rising edge of the buck converter is modulated by the first delay time $t_{delay1}$ to delay the turn on of the first switch after the inductor current curve 621 reaches the valley current as shown in the graph 620 of FIG. 6. Other modulation schemes such as pseudo random or dual random spread spectrum may also be used. The clock generator 102 multiplies the first delay time $t_{delay1}$ by the duty cycle and scaled by a factor of ½ (e.g., +/−10%) and uses the resulting second delay time $t_{delay2}$ to delay the falling edge of the PWM signal. This allows the average converter current (e.g., $i_L$ in FIG. 6) to remain unchanged even as the frequency is dithered, which mitigates or prevents disturbance or perturbation of the current mode control loop implemented by the regulator 110.

A PWM converter, in this example a step-down buck regulator (e.g., FIG. 2), with integrated high-side (HS) switch and low-side (LS) switches (e.g., synchronous rectifier) supplies a regulated output voltage VOUT by turning on the high-side (HS) and low-side (LS) switches with controlled ON time. During the HS switch ON time, the switch node voltage $V_{SW}$ (e.g., graph 600 in FIG. 6) swings up to approximately $V_{IN}$, and the inductor current $i_L$ increases with a linear slope (VIN−VOUT)/L. When the HS switch is turned off by the control logic, the LS switch is turned on after an anti-shoot-through dead time (e.g., implemented by the deadband circuit 120 in FIG. 1). The inductor current discharges through the LS switch with a slope of −VOUT/L. The control parameter of the buck converter in one example is the duty cycle D=$t_{ON}$/$T_{SW}$, where $t_{ON}$ is the HS switch ON time and $T_{SW}$ is the switching period.

In this example, the closed loop of the regulator 110 maintains a constant output voltage VOUT by adjusting the duty cycle D. In an ideal buck converter, where losses are ignored, D is proportional to the output voltage and inversely proportional to the input voltage (e.g., D=VOUT/VIN).

Figure 7:
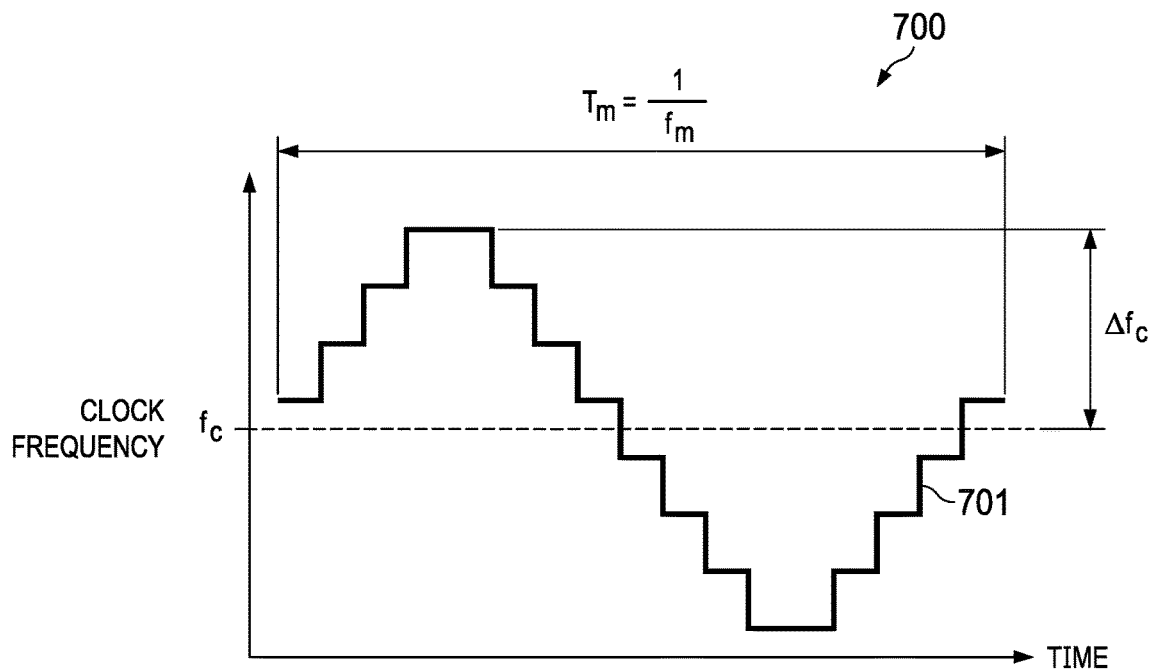
FIG. 7 is a time domain graph of clock frequency as a function of time for an example triangular frequency modulation.

FIGS. 7-10 illustrate spread spectrum frequency modulation to reduce the energy in certain frequency bands to pass regulation standards and reduce switching noise transmitted to other circuits. The switching frequency of the clock (fc) is modulated such that the energy is spread, to lower the peak energy seen at the bandwidth of interest. FIG. 7 shows a time domain graph 700 with a clock frequency curve 701 as a function of time for an example triangular staircase type frequency modulation of the power converter switching frequency $f_C$ showing positive and negative excursions of $\Delta f_C$ from a nominal value at a modulation or modulating frequency $f_m$ (e.g., 15 kHz), where the modulation cycle time $T_m=1/f_m$.

Figure 8:
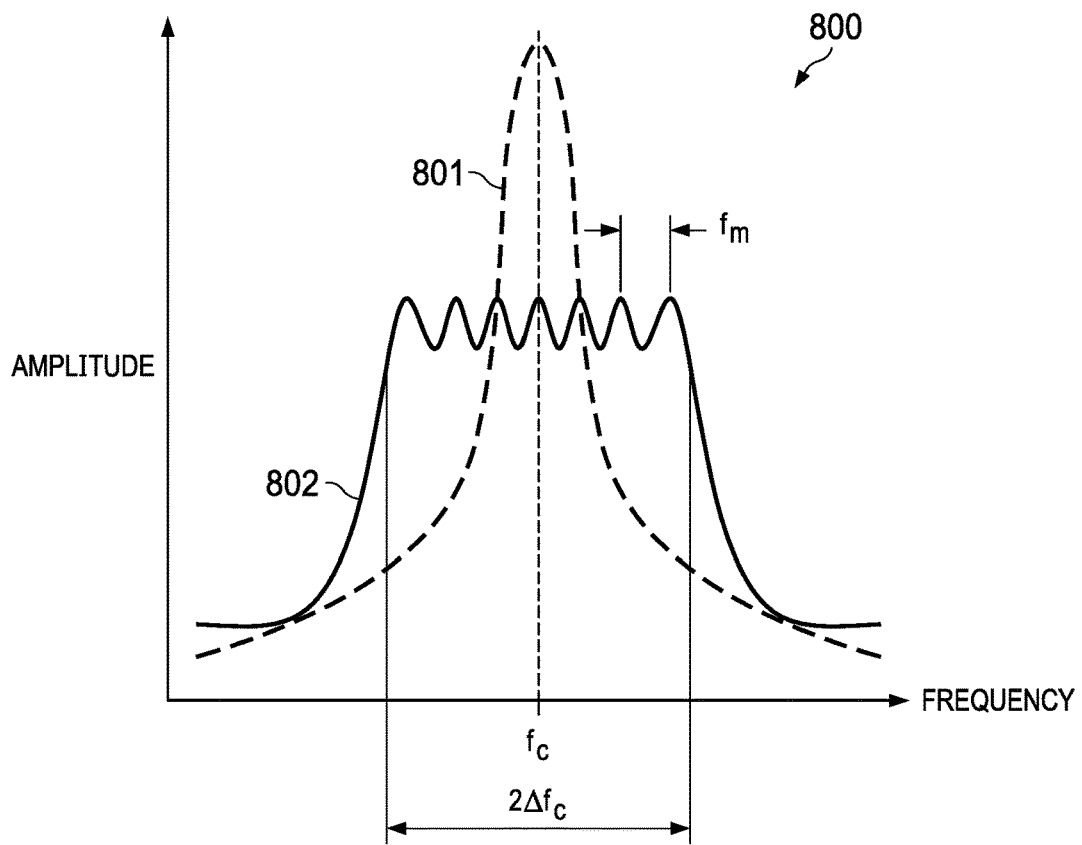
FIG. 8 is a frequency domain graph of the input ripple amplitude for the fundamental switching harmonic for an example triangular frequency modulation effect.

FIG. 8 shows a frequency domain graph 800 of amplitude as a function of time for an example triangular frequency modulation. A first curve 801 shows the noise amplitude as a function of frequency of a converter with no spread spectrum switching frequency modulation, having a large amplitude at the power converter switching frequency $f_C$. A second curve 602 shows the noise amplitude as a function of frequency of a converter with spread spectrum switching frequency modulation at the modulation frequency $f_m$, which shows significantly reduced noise amplitude at the power converter switching frequency $f_C$ compared with the case of the curve 801, as well as lobes spaced apart from one another by the modulation frequency $f_m$ on both sides of the power converter switching frequency $f_C$.

Figure 9:
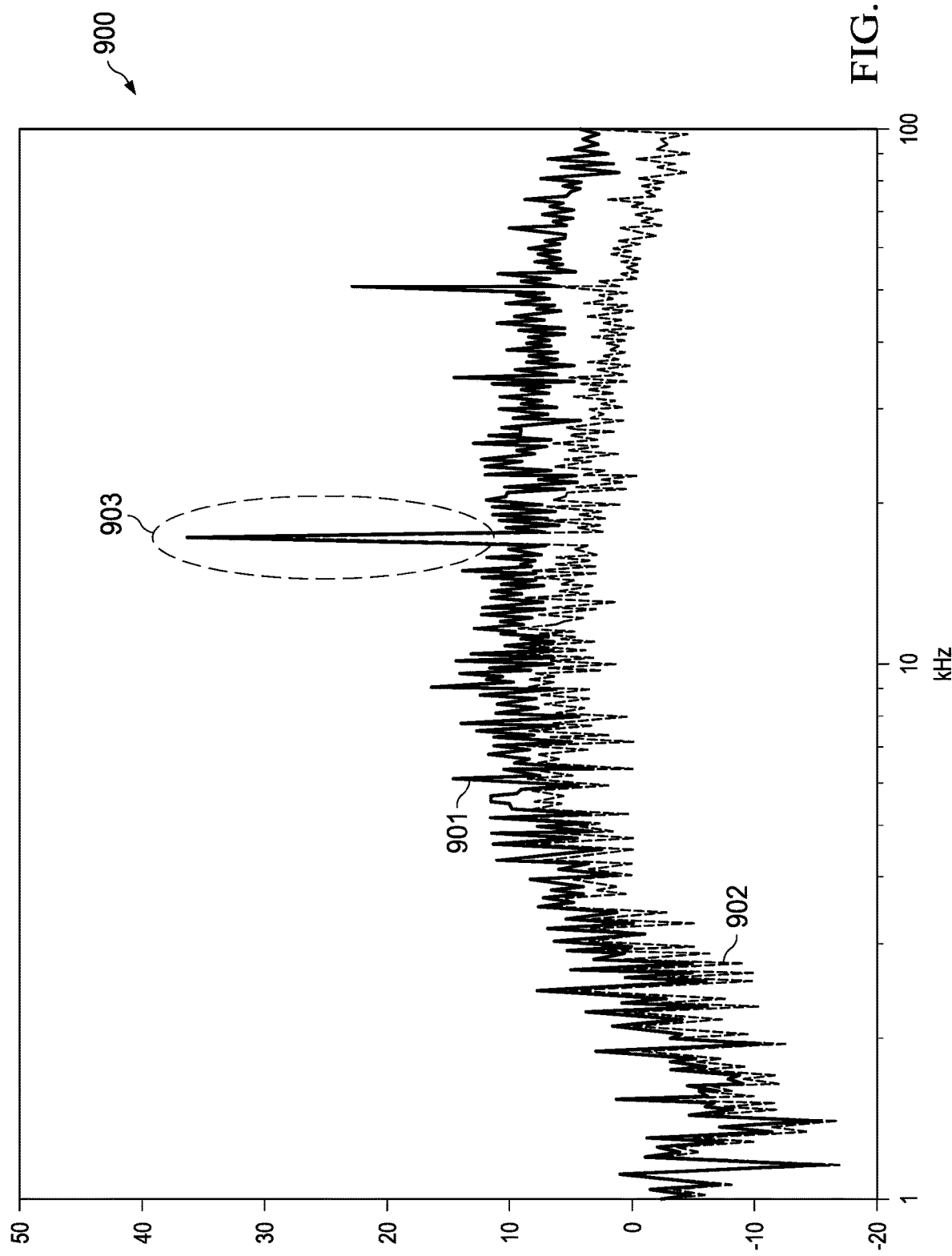
FIG. 9 is a spectrum graph for an example modulating tone for a typical triangular frequency modulation.
Figure 10:
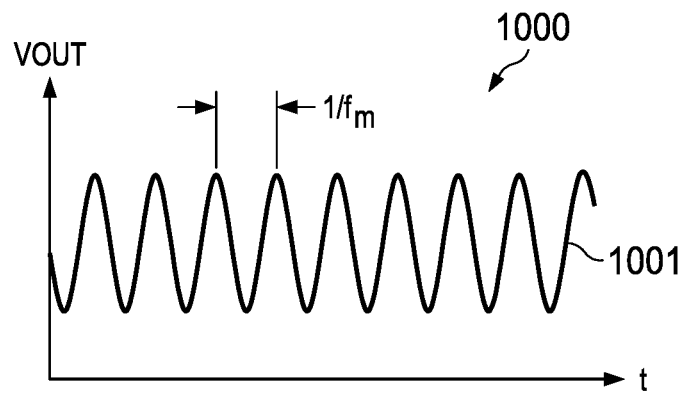
FIG. 10 is a graph of output voltage ripple for an example triangular frequency modulation.

FIG. 9 shows a frequency response graph 900 with output voltage ripple magnitude curves 901 and 902 for an example triangular frequency modulation at a low frequency range, which exhibit a large amplitude at the modulation frequency $f_m$ of the spread spectrum modulation using single edge modulation as shown in the graph 620 of FIG. 6 above. FIG. 10 shows a graph 1000 with a curve 1001 that illustrates output voltage ripple of the power converter output voltage VOUT for the example triangular frequency modulation, with the AC ripple voltage component having peaks spaced by $1/f_m$. As seen in FIGS. 9 and 10, the effects of single edge modulation are seen in the noise at the spread spectrum modulating frequency. This shows up as a low frequency spur(s) in the frequency domain (e.g., FIG. 9) and as ripple on the input and output of the converter (e.g., FIG. 10). These adverse effects are caused by the change in the average current by the single edge frequency modulation of the spread spectrum.

Adding the rising edge delay in combination with the falling edge delay for spread spectrum switching frequency modulation when the current control command is held constant causes the peak of the inductor current to move due to the spread spectrum in a direction opposite to the movement at or near the valley current using current control approaches. Other compensation approaches adjust the duty cycle to match the original duty cycle with a falling edge delay=Duty_Cycle*Delay_Spread Spectrum, then the valley of the inductor will be held constant, and the peak will move with the spread spectrum, but the average current will increase as the spread spectrum delay is increased. The use of the scaling factor of 0.5 (e.g., +/−10%) as shown in the apparatus of FIG. 1 provides a solution for current controlled switching power converters that mitigates or avoids disturbing the average inductor current across a wide range of spread spectrum delay values. Other approaches using voltage control with adjustments to an error signal by an offset signal to compensate regulation control signals can address this problem but require converter inductor information for correct gain adjustment.

Figure 11:
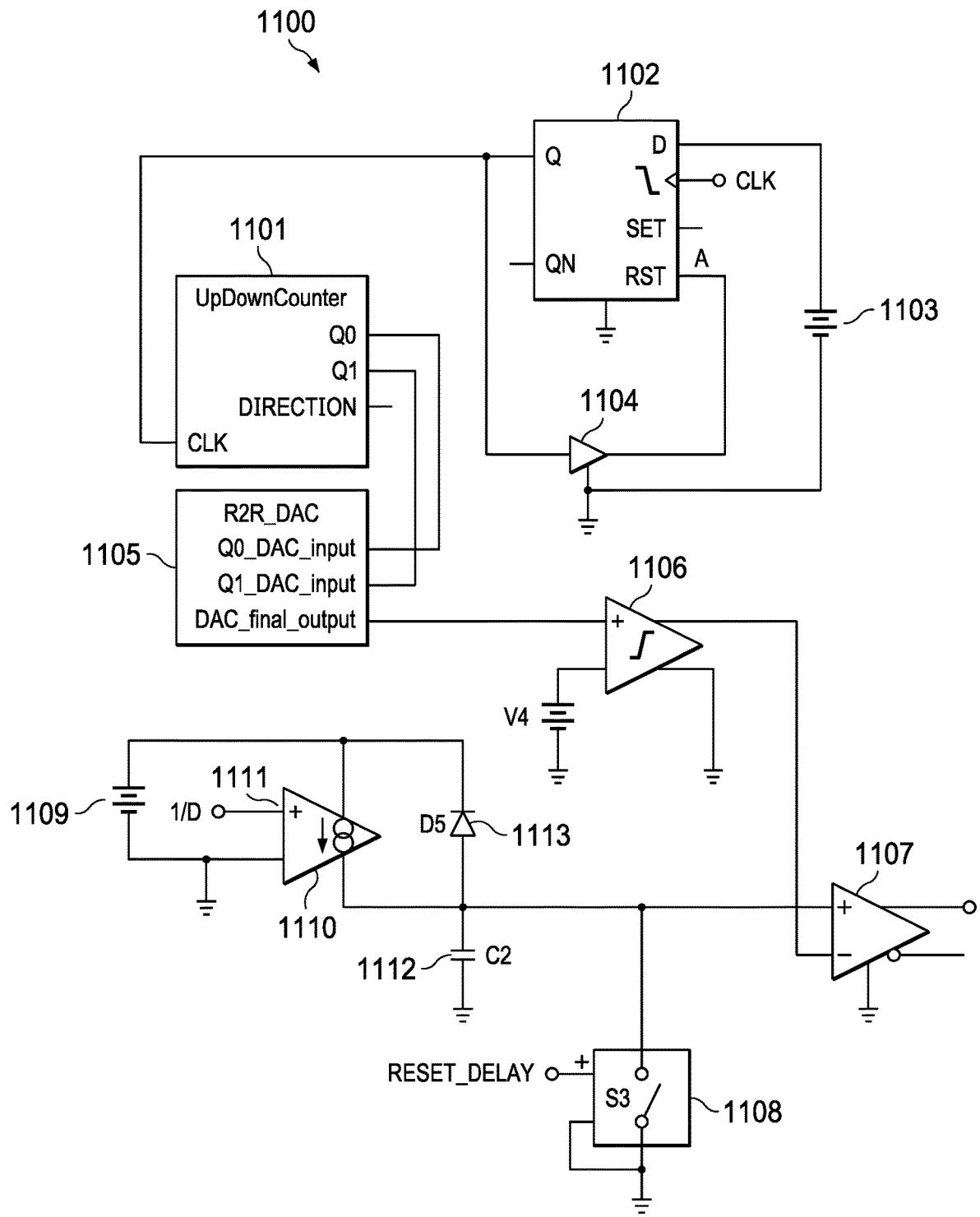
FIG. 11 is a schematic diagram of a clock generator circuit with spread spectrum frequency modulation using a second delay.

FIG. 11 shows a clock generator circuit 1100 with spread spectrum frequency modulation using a second delay, which can be used as or in the clock generator 102 of FIG. 1 and can be used with the circuit of FIG. 5 in one example. A spread spectrum modulation circuit (e.g., modulation circuit 114 in FIG. 1) includes an up/down counter 1101 that receives a clock input from the Q output of a flip-flop 1102 that is operated from a reference clock (not shown) and reset using a buffer 1104. The counter 1101 counts up and then down in repeating fashion and provides a dual bit output from Q0 and Q1 outputs to respective inputs of a digital to analog converter (DAC) 1105. The DAC 1105 provides an analog output to a first amplifier input of a hysteretic amplifier 1106, and a reference voltage is provided to the other amplifier input. The output of the amplifier 1106 provides a signal representing the first delay time $t_{delay1}$ to an inverting input of an output amplifier 1107. The non-inverting input of the amplifier 1107 is coupled to a reset delay switch 1108, an output of a GMA amplifier 1110 and to a charging capacitor 1112. The amplifier 1110 operates as a current source to charge the capacitor 1112 controlled by the duty cycle calculation. A clamping diode 1113 is coupled between the amplifier output and a voltage reference 1109. The amplifier has an input coupled to the output of a duty cycle estimator to receive a signal 1/D (e.g., inverse of 111 in FIG. 1). The output amplifier 1107 provides the high side turn off signal (e.g., second delay output 119 in FIG. 1) to implement spread spectrum references for both rising and falling edge delays.

Figure 12:
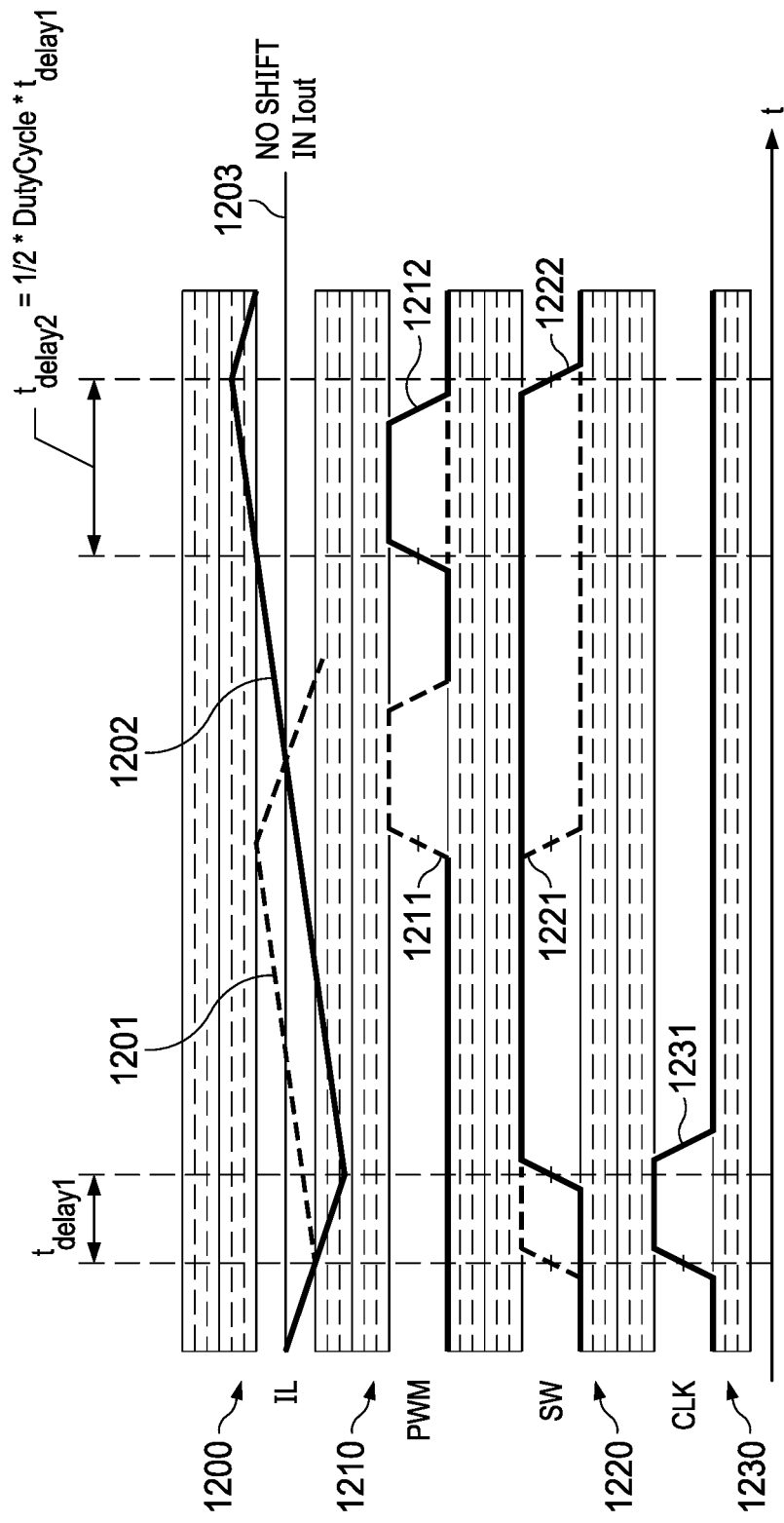
FIG. 12 is a signal diagram of signals in the power converter of FIG. 1 using the clock generator circuit of FIG. 11.
Figure 13:
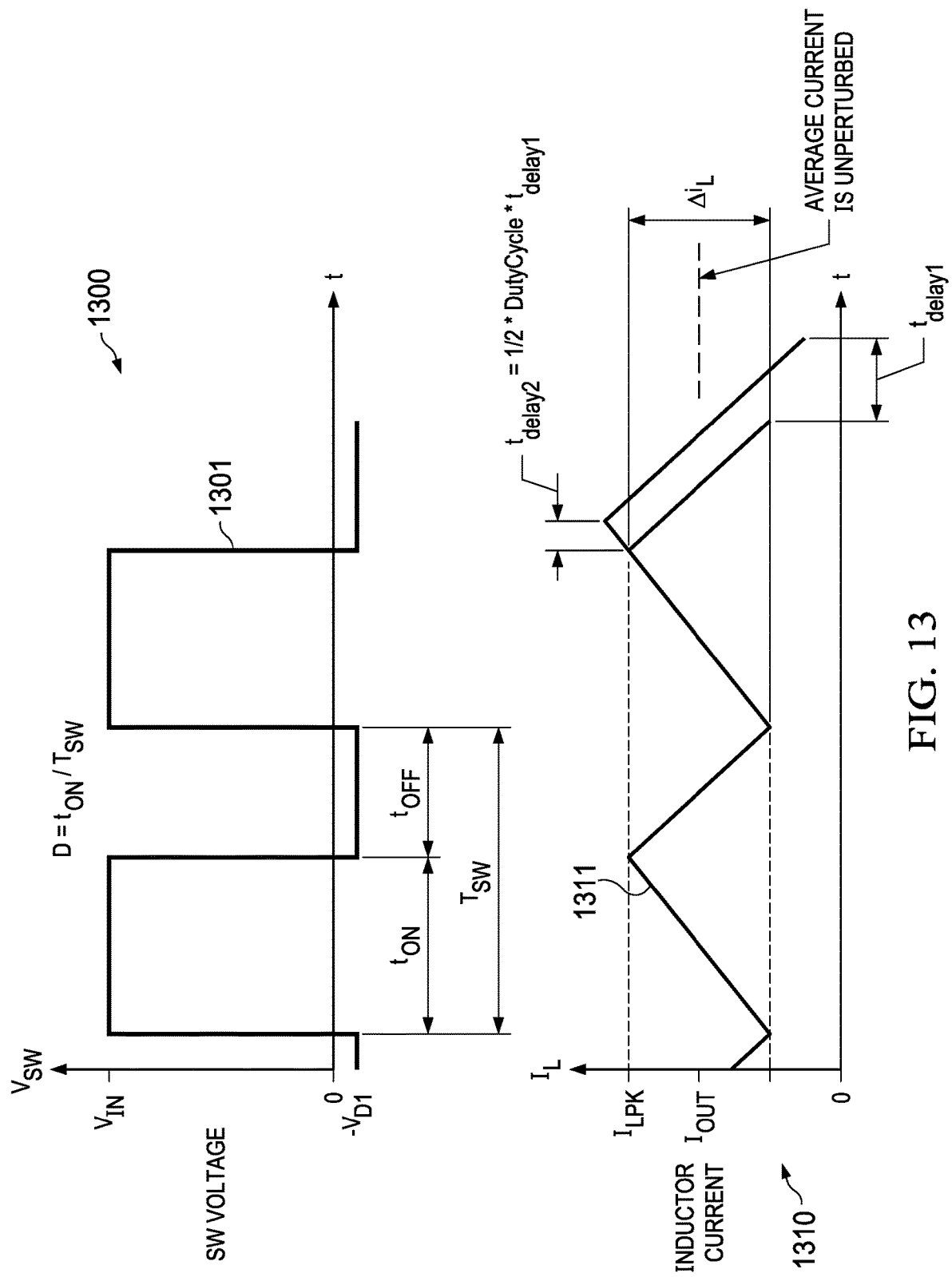
FIG. 13 is a signal diagram of switch node voltage and inductor current of a buck converter, for the schematic in FIG. 1 and delay circuits in FIG. 11.

Referring also to FIGS. 12 and 13, FIG. 12 shows a signal diagram with a graph 1200 having inductor current curves 1201 (with no spread spectrum modulation) and 1202 (with frequency modulation change to slow the converter switching frequency), as well as an average inductor current curve 1203 as a function of time in the power converter 1106 of FIG. 1 using the clock generator circuit 1100 of FIG. 11. A graph 1210 shows PWM signal curves 1211 (with no spread spectrum modulation) and 1212 (with frequency modulation change to slow the converter switching frequency). A graph 1220 includes switch node voltage curves 1221 (with no spread spectrum modulation) and 1222 (with frequency modulation change to slow the converter switching frequency). A graph 1230 shows a clock curve 1231. FIG. 12 also shows examples of the first delay time $t_{delay1}$ and the second delay time $t_{delay2}=0.5*D*t_{delay1}$.

FIG. 13 shows a graph 1300 with a switch node voltage $V_{SW}$ curve 1301 and a graph 1310 with an inductor current curve 1311 (e.g., labeled $i_L$) in the system 100 of FIG. 1. The switch node voltage curve 1301 illustrates two example PWM switching control cycles of the power converter resulting from alternate switching of the first and second (e.g., high and low side switches) switches (e.g., switches 201 and 202 in FIG. 2). The switch node voltage curve 1301 alternates between the input voltage (e.g., labeled $V_{IN}$) when the high side first switch is turned on and a voltage $-V_{D1}$ below zero when the first switch is off. The graph 1310 shows two cycles of an inductor current curve 1311 with spread spectrum modulation to decrease the switching frequency in the second illustrated peak current control switching control cycle. The graph 1310 of FIG. 13 shows the introduction of the falling edge delay ($t_{delay2}=0.5*D*t_{delay1}$) that is approximately ½*Rising Edge Delay*Duty Cycle. This holds the average current constant and the peak command will not need to adjust to the frequency modulation, thus improving the spread of energy across the desired spectrum region, without introducing low frequency noise or distortion.

FIGS. 14 and 15 show a further example which can be used as or in the clock generator 102 of FIG. 1. FIG. 14 shows an example first delay circuit 1400 for spread spectrum frequency modulation (e.g., first delay generator 116 in FIG. 1), and FIG. 15 shows an example second delay circuit 1500 for spread spectrum frequency modulation (e.g., second delay generator 118 in FIG. 1).

The circuit 1400 in FIG. 14 includes a current source 1401 coupled to a charging capacitor 1402 that can be reset (e.g., discharged) by actuation of a switch 1403. The circuit 1400 also includes a multiple bit circuit with x bits for adjusting the first (e.g., rising edge) delay $t_{delay1}$ based on an x-bit spread spectrum modulation, where x is a positive integer greater than 1. The circuit for the first bit includes a charging capacitor 1404 and a switch 1405 operated by a buffer 1406 based on the first modulation control bit (BIT 1). The circuit for the $x^{th}$ bit includes a charging capacitor 1407 and a switch 1408 operated by a buffer 1409 based on the $x^{th}$ modulation control bit (BIT x). A comparator 1412 compares the capacitor voltage to a voltage reference 1410 and provides the output signal PWM_START as a first output signal (e.g., HSON in FIG. 1) and resets the circuit 1400 by closing the switch 1403. In this implementation, the main clock which controls the rising edge is implemented as a current source 1401 into the charging capacitor 1404. When the voltage on the capacitor 1404 reaches the reference, a clock pulse is generated and the oscillator 1400 is reset. The frequency is set by an equation period(t)=capacitance(F)*1 (V)/current(A). The circuit 1400 implements spread spectrum frequency modulation by adding in capacitors according to the spread spectrum pattern. This creates the rising edge delay $t_{delay1}$.

The circuit 1500 in FIG. 15 includes a current source 1501 sized the same as the current source 1401, as well as a reset switch 1503. The circuit 1500 also includes a multiple bit circuit with x bits for adjusting the second (e.g., falling edge) delay $t_{delay2}=0.5*D*t_{delay1}$ based on an x-bit spread spectrum modulation, where x is a positive integer greater than 1. The circuit for the first bit includes a charging capacitor 1504 and a switch 1505 operated by a buffer 1506 based on the first modulation control bit (BIT 1). The circuit for the $x^{th}$ bit includes a charging capacitor 1507 and a switch 1508 operated by a buffer 1509 based on the $x^{th}$ modulation control bit (BIT x). A comparator 1512 compares the capacitor voltage to the duty cycle voltage signal D and provides the output signal DELAY FALLING EDGE as a second output signal (e.g., HSOFF in FIG. 1). The circuit 1500 is reset by a signal PWM_END that closes the discharge switch 1503. In FIG. 15, the circuit 1500 creates the falling edge delay in a slightly similar way to the rising edge delay circuit 1400, but the main capacitor is removed so only the delay capacitors are included. The capacitors 1504 and 1507 are half the value of the respective capacitors 1404 and 1407. Additionally, the voltage on the comparator 1503 is compared to the duty cycle voltage signal D (e.g., from the duty cycle estimator 111 in FIG. 1 or from the circuit 300 in FIG. 3). The delay is calculated by delay=delay capacitance*duty cycle/current. The circuit 1500 is triggered by the turn off command for the falling edge and implements a delay to the falling edge=½ *Duty Cycle*Rising Edge Delay.

Figure 16:
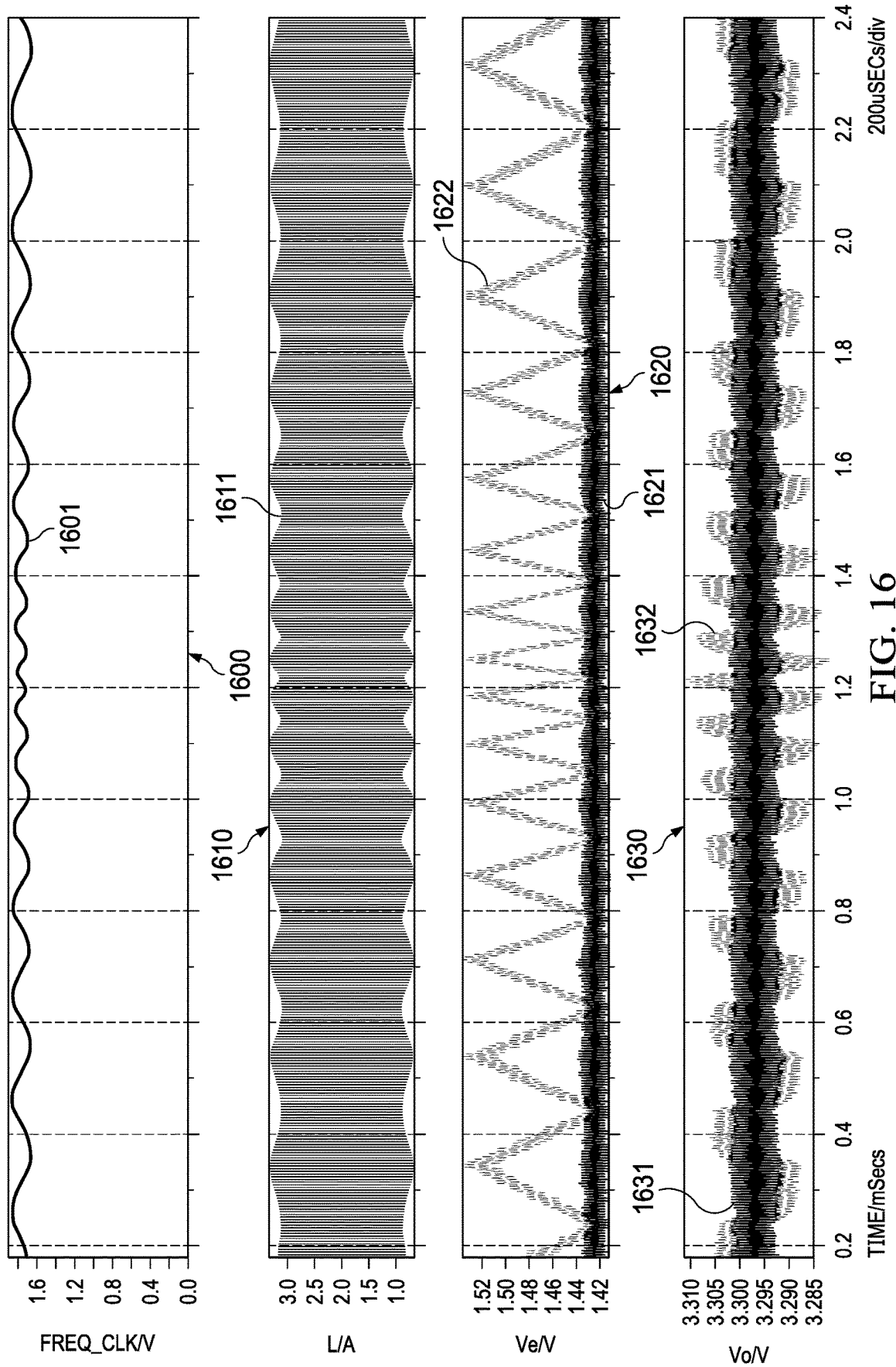
FIG. 16 is a signal diagram with simulated signals of the power converter as a function of time using the circuits of FIGS. 14 and 15.
Figure 17:
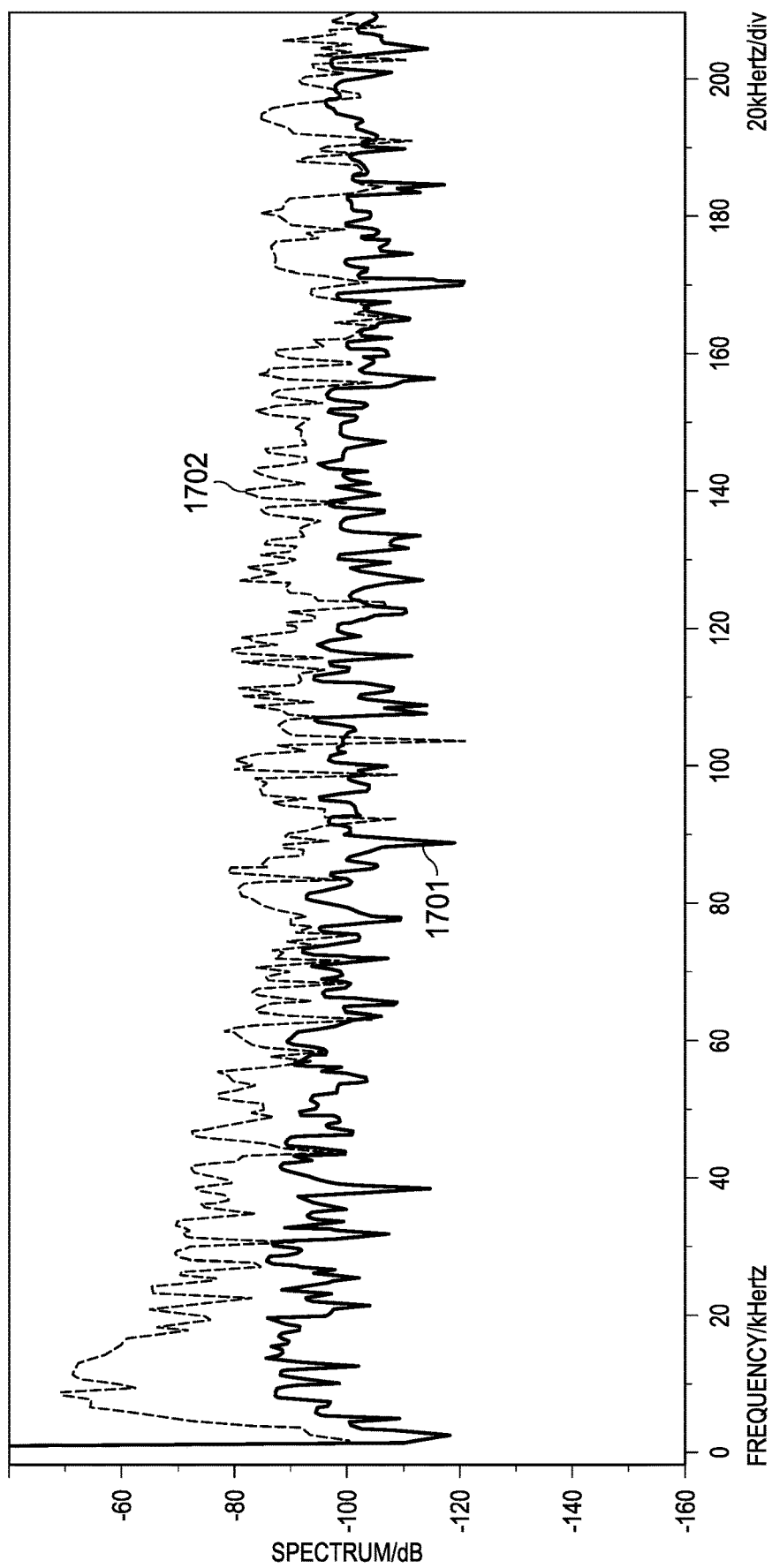
FIG. 17 is a signal diagram with simulated FFT signals of the power converter using the circuits of FIGS. 14 and 15.

Referring also to FIGS. 16 and 17, FIG. 16 shows a signal diagram with simulated signals of the power converter as a function of time using the circuits of FIGS. 14 and 15. A graph 1600 has a power converter switching frequency curve 1601 that is modulated by the spread spectrum modulation at the modulating frequency (e.g., 15 kHz). A graph 1610 shows an inductor current curve 1611. A graph 1620 shows a first control command curve 1621 with the second delay generator 118 on, and a second control command curve 1622 with the second delay generator 118 off. A graph 1630 shows a first output voltage curve 1631 with the second delay generator 118 on, and a second output voltage curve 1632 with the second delay generator 118 off. FIG. 17 shows a signal diagram with simulated first fast Fourier transform (FFT) signal curve 1701 of the power converter using the circuits of FIGS. 14 and 15 with the second delay generator 118 on, and a second FFT curve 1702 with the second delay generator 118 off.

Figure 18:
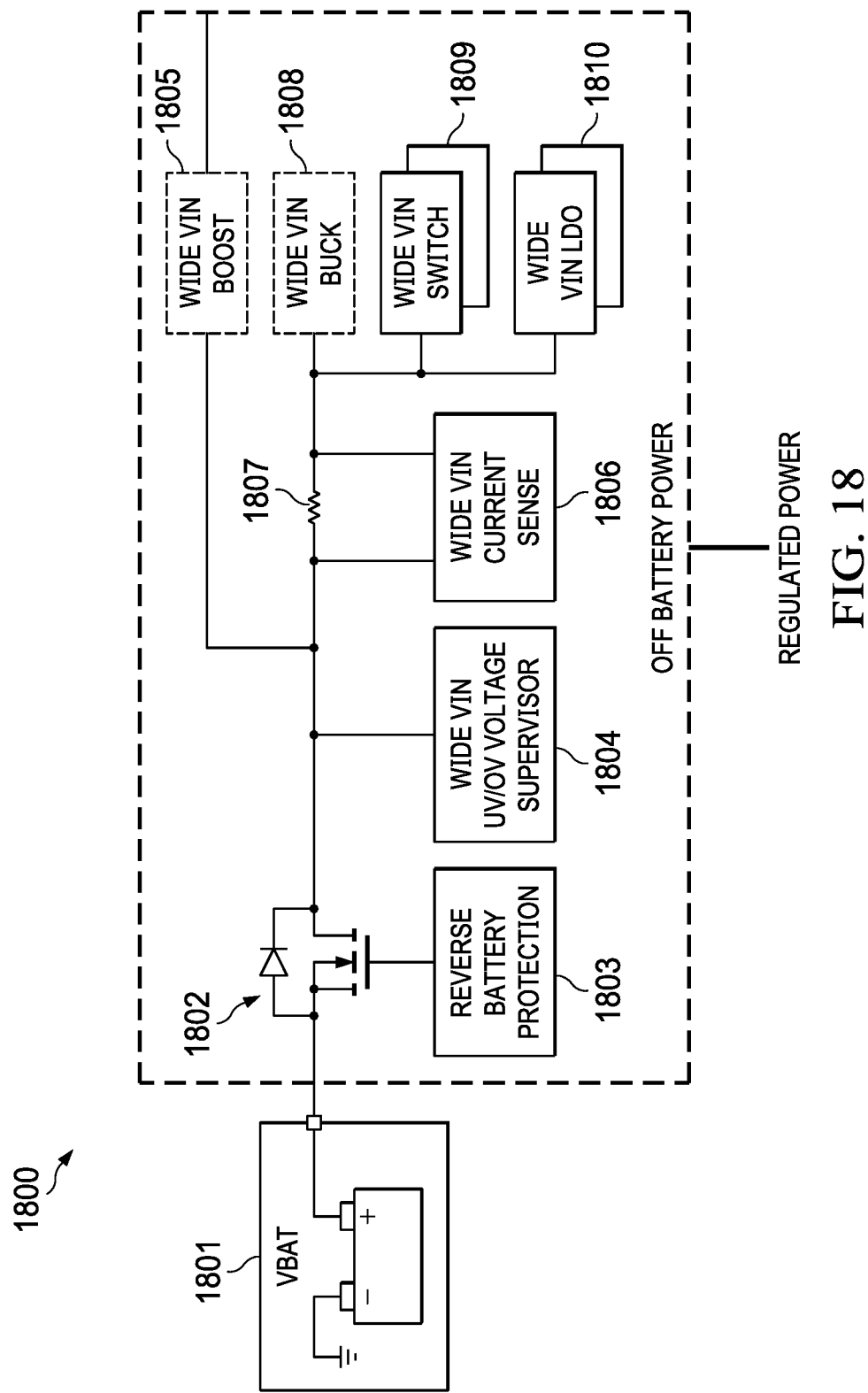
FIG. 18 is a system diagram of an automotive power system.

FIG. 18 shows a system diagram of an automotive power system 1800 in which the power system 100 of FIG. 1 can be employed. The system 1800 includes a battery 1801 and a protection transistor 1802 operated by a reverse battery protection circuit 1803. The protected side of the system 1800 includes a wide input voltage undervoltage/overvoltage supervisor circuit 1804 and a power converter operated as a wide input voltage boost converter 1805 that can include the dual edge spread spectrum modulation apparatus of FIG. 1. The system 1800 also includes a wide input voltage current sense circuit 1806 and an associated current sense resistor 1807. This example also includes a wide input voltage buck converter, that can be implemented as the system 100 of FIG. 1, as well as a wide input voltage switch 1809 and a wide input voltage low dropout regulator (LDO) 1810. The system 1800 in FIG. 18 is an example automotive system that benefits from enhanced spread spectrum switching frequency modulation. Other example applications include audio, radio and radar applications that can benefit from improved dithering to pass CISPR 25 specifications.

Figure 19:
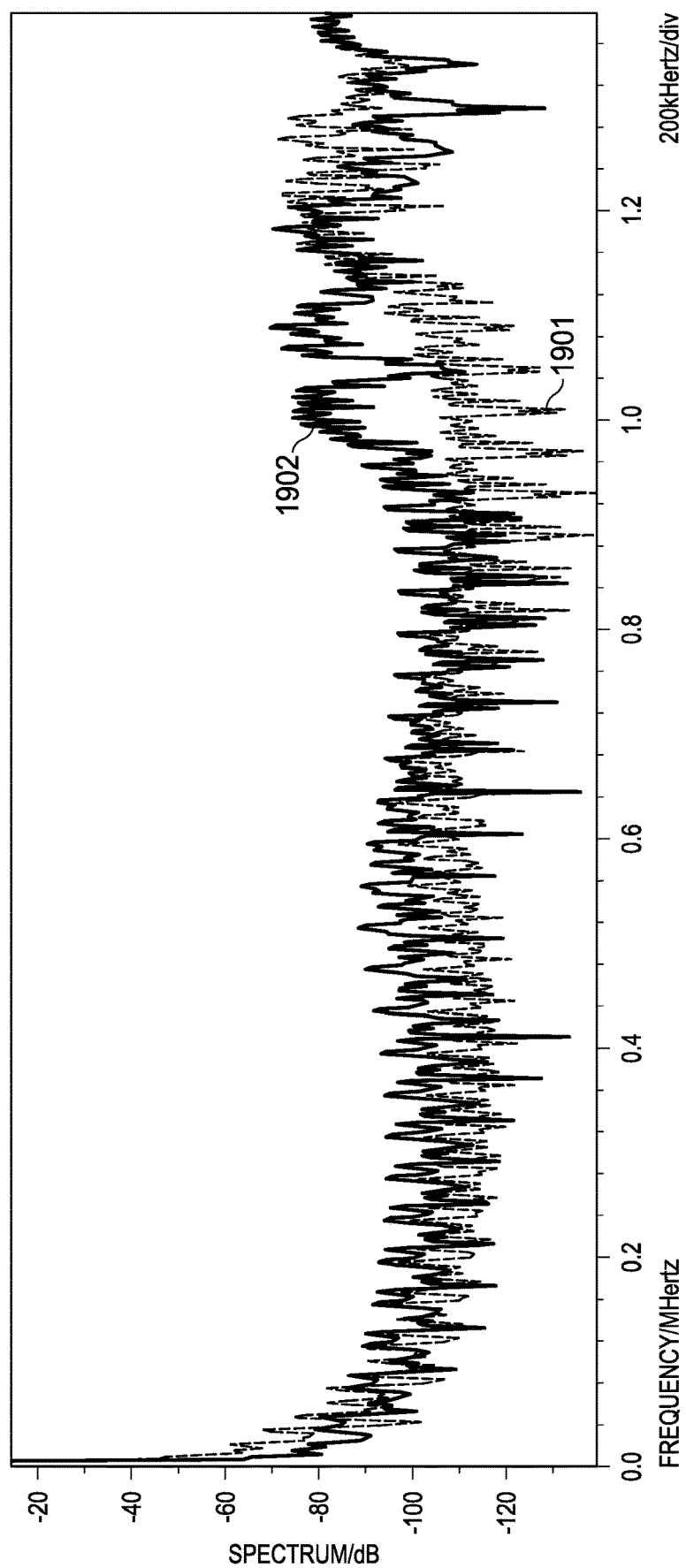
FIG. 19 is a signal diagram with simulated FFT signals.
Figure 20:
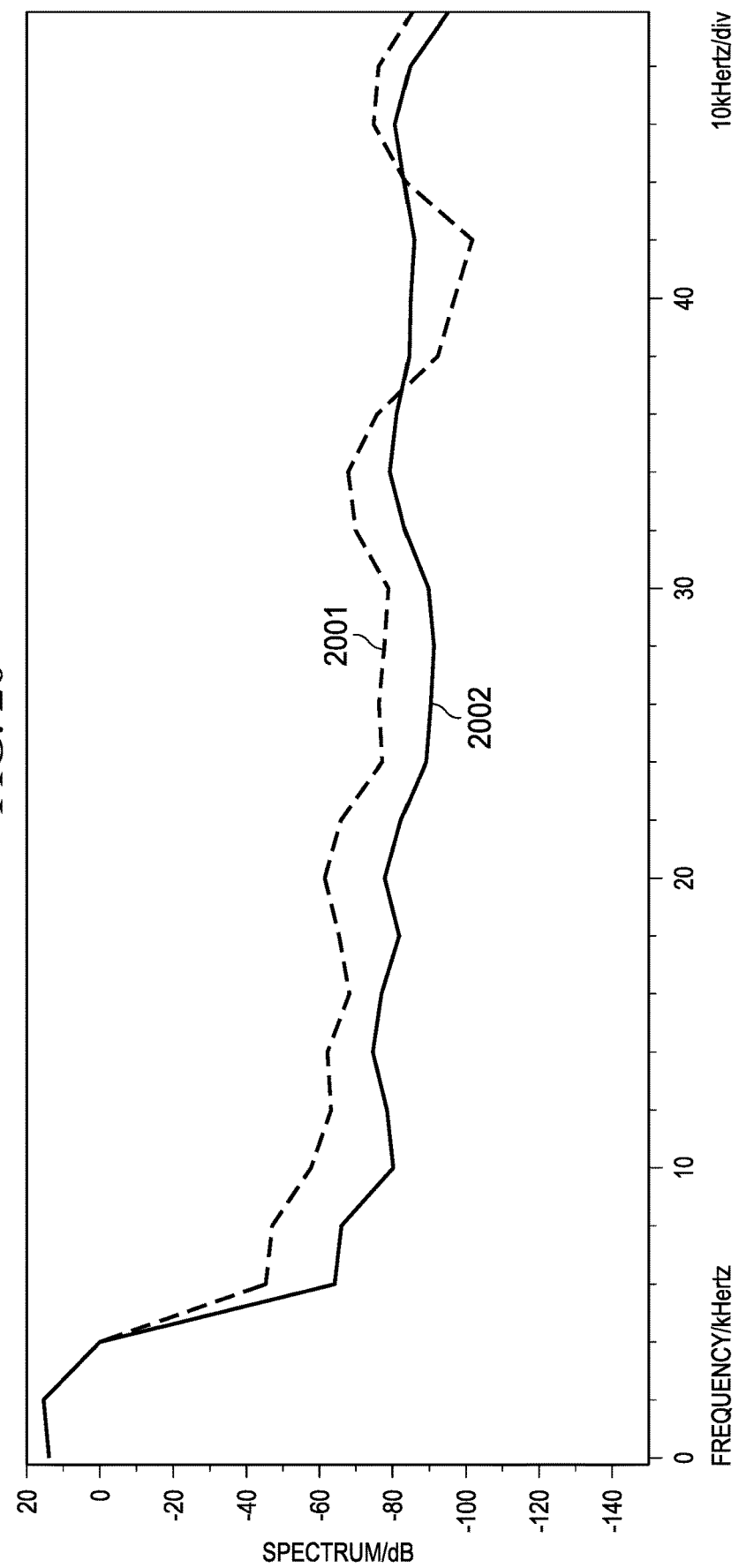
FIG. 20 is a signal diagram with simulated FFT signals at low frequencies.

Referring also to FIGS. 19 and 20, a graph 1900 in FIG. 19 shows a simulated first FFT signal curve 1901 of the power converter using the circuits of FIGS. 14 and 15 with the second delay generator 118 on, and a second FFT curve 1902 with the second delay generator 118 off, showing where the second delay generator 118 provides significant improvement. FIG. 20 shows a signal diagram 2000 with simulated FFT signals 2001 and 2002 of the system performance at lower frequencies for the respective cases of the second delay generator 118 off (curve 2001), and with the second delay generator 118 on (curve 2002). The described apparatus of FIG. 1 provides advantages over typical dither approaches, particularly at lower frequencies, where the curves 1901 and 2002 show noise performance of ~7dBuV (due to slope compensation error), and the curves 1902 and 2001 show a performance spectrum of 31.4dBuV (including slope compensation error), for an improvement of ~24dBuV. The simulation conditions include a 12 V input voltage, an output voltage of 3.3 V, a nominal switching frequency of 1.0 MHz, an output current of 1.0 A, an output capacitance of $1\times10^{-5}$ coulombs, an input capacitance of $1.5\times10^{-4}$ coulombs, and an output inductance of $6\times10^{-6}$ henry.

Figure 21:
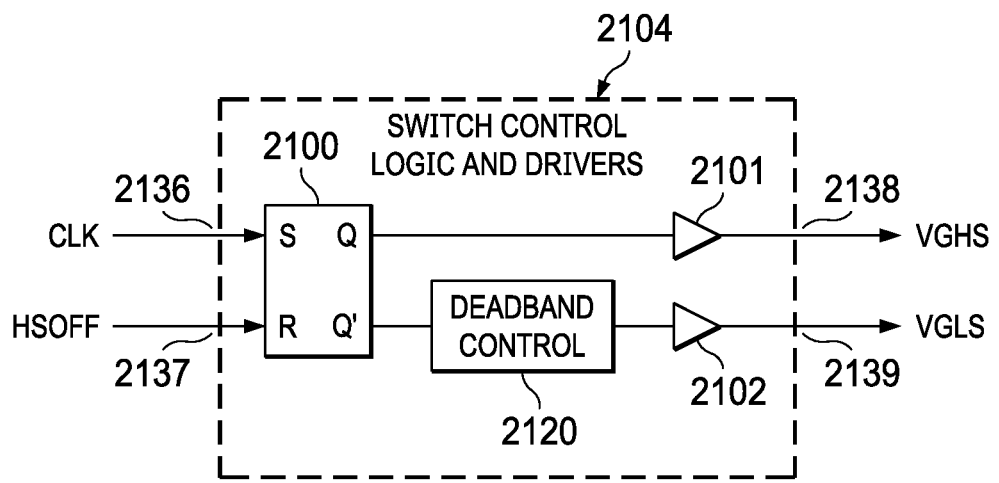
FIG. 21 is a schematic diagram of an example switch control logic and driver circuit.

FIG. 21 shows an example switch control logic and driver circuit 2104 that can be used as or in the switch control logic and driver circuit 104 of FIG. 1. The circuit 2104 includes a flip-flop 2100 with a set (S) input 2136 coupled to the first switch signal (e.g., HSON or the PWM clock signal CLK in FIG. 1), as well as a reset input (R) coupled to the second switch signal (e.g., HSOFF in FIG. 1). The data output Q of the flip-flop 2100 is coupled to the input of a first driver 2101, and the output 2138 of the first driver 2101 provides the first switch control signal VGHS. The inverted data output Q' of the flip-flop 2100 is coupled to the input of a deadband control circuit 2120 (e.g., deadband control circuit 120 in FIG. 1). The output of the deadband control circuit 2120 is coupled to the input of a second driver 2102, and the output 2139 of the second driver 2102 provides the second switch control signal VGLS.

In view of the foregoing structural and functional features, the examples disclosed herein compensate for the effect of the frequency changes on converter steady state functionality in order to lower the power of the noise while reducing output ripple. The dual edged delay solutions disclosed herein may be implemented to lower the noise for any type of frequency modulation scheme. Benefits of the described examples include reduced low frequency noise, reducing the cost of passive or active filtering by using different delays on both the rising and falling edge of the power stage switching node, such that the operating point of the control loop is unperturbed and the average current of the inductor is constant. The benefit of this implementation is improved EMI performance at lower frequencies.

As used herein, the term circuit can include a collection of active and/or passive elements that perform a circuit function such as an analog circuit or control circuit. Additionally, or alternatively, the term circuit can include an integrated circuit (IC) where all or some of the circuit elements are fabricated on a common substrate, such as a semiconductor device (e.g., IC chip or die). In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

Modifications are possible in the described examples, and other implementations are possible, within the scope of the claims.

What is claimed is:

1. An apparatus, comprising:
a regulator having a feedback input, a regulator control output, and a duty cycle output, the feedback input adapted to be coupled to a power output of a power converter;
a clock generator having a spread spectrum modulation circuit, a first delay generator, a second delay generator, a first output, and a second output, the spread spectrum modulation circuit having a modulation output, the first delay generator having an input and a first delay output, the input of the first delay generator coupled to the modulation output, and the first delay output coupled to the first output, the second delay generator having a first input, a second input, a duty cycle input, and a second delay output, the first input of the second delay generator coupled to the modulation output, the duty cycle input coupled to the duty cycle output, and the second delay output coupled to the second output;
a current control comparator having first and second comparator inputs and a comparator output, the first comparator input coupled to a current sense output of the power converter, the second comparator input coupled to the regulator control output, and the comparator output coupled to the second input of the second delay generator; and
a driver circuit having a first signal input, a second signal input, a first signal output, and a second signal output, the first signal input coupled to the first output, the second signal input coupled to the second output, the first signal output adapted to be coupled to a first switch control input of the power converter, and the second signal output adapted to be coupled to a second switch control input of the power converter.

2. The apparatus of claim 1, wherein:
the current control comparator is configured to generate, at the comparator output, a comparator output signal based on a converter current signal of the first comparator input and a regulator control output signal of the second comparator input;
the regulator is configured to generate, at the duty cycle output, a duty cycle signal based on a voltage of the power output and a voltage of a power input of the power converter;

the spread spectrum modulation circuit is configured to generate, at the modulation output, a modulation signal at a spread spectrum modulating frequency;

the first delay generator is configured to generate, at the first delay output, a first switch signal based on the modulation signal; and the second delay generator is configured to generate, at the second delay output, a second switch signal based on the first switch signal, the duty cycle signal, and the comparator output signal.

3. The apparatus of claim 2, wherein:

the duty cycle signal represents a duty cycle of the power converter;

the first switch signal has a first edge that is delayed, from an edge of a reference clock signal, by a first delay time, the first delay time based on the modulation signal; and the second switch signal has a second edge that is delayed, from an edge of the comparator output signal, by a second delay time, the second delay time less than a product of the first delay time and the duty cycle of the power converter.

4. The apparatus of claim 3, wherein the second delay time is approximately half the product of the first delay time and the duty cycle of the power converter.

5. The apparatus of claim 4, wherein the driver circuit is configured to:

generate, at the first signal output, a first switch control signal having a first edge and a second edge in a switching cycle of the power converter, the first edge of the first switch control signal to control turn on of a first switch of the power converter in the switching cycle, and the second edge of the first switch control signal to control turn off of the first switch in the switching cycle;

control timing of the first edge of the first switch control signal based on the first switch signal;

control timing of the second edge of the first switch control signal based on the second switch signal;

generate, at the second signal output, a second switch control signal having a first edge and a second edge in the switching cycle, the first edge of the second switch control signal to control turn on of a second switch of the power converter in the switching cycle, and the second edge of the second switch control signal to control turn off of the second switch in the switching cycle;

control timing of the first edge of the second switch control signal based on the second switch signal and a deadband delay; and control timing of the second edge of the second switch control signal based on the first switch signal and the deadband delay.

6. The apparatus of claim 1, wherein:

the regulator is configured to generate, at the regulator control output, a regulator control output signal to control a current of the power converter to regulate a voltage of the power output;

the spread spectrum modulation circuit is configured to modulate a switching frequency of the power converter at a spread spectrum modulating frequency;

the first delay generator is configured to control a first delay time to turn on a first switch of the power converter in a switching cycle, based on a change in the switching frequency of the power converter; and the second delay generator is configured to control a second delay time to turn the first switch of the power converter off in the switching cycle, based on the first delay time and a duty cycle of the power converter.

7. The apparatus of claim 6, wherein the second delay generator is configured to control the second delay time to be less than a product of the first delay time and the duty cycle of the power converter.

8. The apparatus of claim 7, wherein the second delay generator is configured to control the second delay time to be approximately half the product of the first delay time and the duty cycle of the power converter.

9. An apparatus, comprising:

a regulator configured to generate a regulator control output signal to control a current of a power converter to regulate an output voltage of the power converter;

a modulation circuit configured to modulate a switching frequency of the power converter;

a first delay generator configured to control a first delay time to turn on a switch of the power converter in a switching cycle, based on a change in the switching frequency of the power converter; and a second delay generator configured to control a second delay time to turn the switch of the power converter off in the switching cycle, based on the first delay time and a duty cycle of the power converter.

10. The apparatus of claim 9, wherein the second delay generator is configured to control the second delay time to be less than a product of the first delay time and the duty cycle of the power converter.

11. The apparatus of claim 10, wherein the second delay generator is configured to control the second delay time to be approximately half the product of the first delay time and the duty cycle of the power converter.

12. The apparatus of claim 10, further comprising a driver circuit configured to:

generate a forst switch control signal to control the switch based on a first switch signal of the first delay generator, the first switch control signal having a first edge and a second edge in the switching cycle of the power converter, the first edge of the first switch control signal to turn on the switch of the power converter, and the second edge of the first switch control signal to control turn off of the switch in the switching cycle; and generate a second switch control signal to control a second switch of the power converter in the switching cycle based on the regulator control output signal of the regulator and a second switch signal of the second delay generator, the second switch control signal having a first edge and a second edge in the switching cycle, the first edge of the second switch control signal to turn on the second switch of the power converter in the switching cycle, and the second edge of the second switch control signal to control turn off of the second switch in the switching cycle;

wherein:

the first delay generator is configured to control timing of the first edge of the first switch control signal based on the first delay time; and the second delay generator is configured to control timing of the second edge of the first switch control signal based on the second delay time.

13. The apparatus of claim 9, further comprising a driver circuit configured to:

generate a first switch control signal to control the first switch based on a first switch signal of the first delay generator, the first switch control signal having a first edge and a second edge in the switching cycle of the power converter, the first edge of the first switch control signal to turn on the first switch of the power converter, and the second edge of the first switch control signal to control turn off of the first switch in the switching cycle; and generate a second switch control signal to control a second switch of the power converter in the switching cycle based on the regulator control output signal of the regulator and a second switch signal of the second delay generator, the second switch control signal having a first edge and a second edge in the switching cycle, the first edge of the second switch control signal to turn on the second switch of the power converter in the switching cycle, and the second edge of the second switch control signal to control turn off of the second switch in the switching cycle.

14. The apparatus of claim 13, wherein:

the first delay generator is configured to control timing of the first edge of the first switch control signal based on the first delay time, and control timing of the second edge of the first switch control signal based on the second delay time; and second delay generator configured to control timing of the first edge of the second switch control signal based on the second delay time and a deadband delay, and control timing of the second edge of the second switch control signal based on the second delay time and the deadband delay.

15. A system, comprising:

a power converter configured to receive an input voltage and provide an output voltage;

a regulator configured to generate a regulator control output signal to control a current of the power converter to regulate the output voltage;

a modulation circuit configured to modulate a switching frequency of the power converter;

a first delay generator configured to control a first delay time to turn on a switch of the power converter in a switching cycle, based on a change in the switching frequency of the power converter; and a second delay generator configured to control a second delay time to turn the switch of the power converter off in the switching cycle, based on the first delay time and a duty cycle of the power converter.

16. The system of claim 15, wherein the second delay generator is configured to control the second delay time to be less than a product of the first delay time and the duty cycle of the power converter.

17. The system of claim 16, wherein the second delay generator is configured to control the second delay time to be approximately half the product of the first delay time and the duty cycle of the power converter.

18. The system of claim 16, further comprising a driver circuit configured to:

generate a first switch control signal to control the switch based on a first switch signal of the first delay generator, the first switch control signal having a first edge and a second edge in the switching cycle of the power converter, the first edge of the first switch control signal to turn on the switch of the power converter, and the second edge of the first switch control signal to control turn off of the switch in the switching cycle; and generate a second switch control signal to control a second switch of the power converter in the switching cycle based on the regulator control output signal of the regulator and a second switch signal of the second delay generator, the second switch control signal having a first edge and a second edge in the switching cycle, the first edge of the second switch control signal to turn on the second switch of the power converter in the switching cycle, and the second edge of the second switch control signal to control turn off of the second switch in the switching cycle;

wherein:

the first delay generator is configured to control timing of the first edge of the first switch control signal based on the first delay time, and control timing of the second edge of the first switch control signal based on the second delay time; and second delay generator configured to control timing of the first edge of the second switch control signal based on the second delay time and a deadband delay, and control timing of the second edge of the second switch control signal based on the second delay time and the deadband delay.

19. The system of claim 15, further comprising a driver circuit configured to:

generate a first switch control signal to control the first switch based on a first switch signal of the first delay generator, the first switch control signal having a first edge and a second edge in the switching cycle of the power converter, the first edge of the first switch control signal to turn on the first switch of the power converter, and the second edge of the first switch control signal to control turn off of the first switch in the switching cycle; and generate a second switch control signal to control a second switch of the power converter in the switching cycle based on the regulator control output signal of the regulator and a second switch signal of the second delay generator, the second switch control signal having a first edge and a second edge in the switching cycle, the first edge of the second switch control signal to turn on the second switch of the power converter in the switching cycle, and the second edge of the second switch control signal to control turn off of the second switch in the switching cycle.

20. The system of claim 19, wherein:

the first delay generator is configured to control timing of the first edge of the first switch control signal based on the first delay time, and control timing of the second edge of the first switch control signal based on the second delay time; and second delay generator configured to control timing of the first edge of the second switch control signal based on the second delay time and a deadband delay, and control timing of the second edge of the second switch control signal based on the second delay time and the deadband delay.

* * * * *